United States Patent
Yasui et al.

(10) Patent No.: US 8,674,309 B2
(45) Date of Patent: Mar. 18, 2014

(54) SCINTILLATOR CRYSTAL BODY, METHOD FOR MANUFACTURING THE SAME, AND RADIATION DETECTOR

(75) Inventors: Nobuhiro Yasui, Yokohama (JP); Yoshihiro Ohashi, Tokyo (JP); Toru Den, Tokyo (JP); Ryoko Horie, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/574,981

(22) PCT Filed: Jan. 12, 2011

(86) PCT No.: PCT/JP2011/050798
§ 371 (c)(1),
(2), (4) Date: Jul. 24, 2012

(87) PCT Pub. No.: WO2011/093176
PCT Pub. Date: Aug. 4, 2011

(65) Prior Publication Data
US 2012/0292516 A1    Nov. 22, 2012

(30) Foreign Application Priority Data

Jan. 28, 2010 (JP) .................. 2010-017378
Apr. 7, 2010 (JP) .................. 2010-088982
Jul. 16, 2010 (JP) .................. 2010-162017
Dec. 2, 2010 (JP) .................. 2010-269728

(51) Int. Cl.
*G01T 1/10* (2006.01)
(52) U.S. Cl.
USPC .................................................. 250/361 R
(58) Field of Classification Search
USPC .................................................. 250/361 R
See application file for complete search history.

(56) References Cited

U.S. PATENT DOCUMENTS

| | | | |
|---|---|---|---|
| 4,710,907 A | | 12/1987 | Kobayashi |
| 5,445,846 A | * | 8/1995 | Yoshida ................. 427/65 |
| 5,876,630 A | | 3/1999 | Vinograd |
| 6,744,052 B1 | * | 6/2004 | Petersson et al. ....... 250/370.11 |
| 7,501,077 B1 | | 3/2009 | Hodges |
| 2005/0285041 A1 | | 12/2005 | Srivastava |
| 2007/0075254 A1 | | 4/2007 | Shoji |
| 2008/0001086 A1 | | 1/2008 | Srivastava |

FOREIGN PATENT DOCUMENTS

| | | |
|---|---|---|
| CN | 1519581 A | 8/2004 |
| CN | 1715364 A | 1/2006 |
| CN | 1834201 A | 9/2006 |
| CN | 1886677 A | 12/2006 |
| CN | 101479361 A | 7/2009 |

(Continued)

*Primary Examiner* — Kiho Kim
(74) *Attorney, Agent, or Firm* — Canon U.S.A., Inc., IP Division

(57) ABSTRACT

In a scintillator used for radiation detection, such as an X-ray CT scanner, a scintillation crystal body having a unidirectional phase separation structure is provided which has a light guide function for crosstalk prevention without using partitions. The phase separation structure includes a first crystal phase and a second crystal phase having a refractive index larger than that of the first crystal phase and which have a first principal surface and a second principal surface, these principal surfaces being not located on the same plane, the first principal surface and the second principal surface have portions to which the second crystal phase is exposed, and a portion of the second crystal phase exposed to the first principal surface and a portion of the second crystal phase exposed to the second principal surface are connected to each other.

26 Claims, 30 Drawing Sheets

(56) References Cited

FOREIGN PATENT DOCUMENTS

| | | |
|---|---|---|
| JP | 54-035060 A | 3/1979 |
| JP | 2003-147343 A | 5/2003 |
| JP | 2007-139604 A | 6/2007 |
| JP | 2008-145335 A | 6/2008 |
| JP | 2008-145335A A | 6/2008 |
| JP | 2012-047690 A | 3/2012 |
| WO | 2007-040042 A1 | 4/2007 |
| WO | 2011/136224 A1 | 11/2011 |
| WO | 2012/060394 A1 | 5/2012 |

\* cited by examiner

10 μm

10 μm

40 μm

40 μm

40 μm

20 μm

O, △ INDICATE POSITIONS OF ELECTRON BEAM EXCITATION
(THREE OUT OF SIX POINTS ARE SHOWN)

50 μm

50 μm

LIGHT

50 μm

50 μm

50 μm

50 μm

NaI-CsI

NaI-RbI

NaI-RbI

NaI-NaCl

50 μm

NaI-NaF

50 μm

CsBr-NaF

50 μm

CsBr-NaCl

50 μm

CsBr-NaBr

50 μm

RbBr-NaF

50 μm

RbBr-NaCl

50 μm

RbBr-NaBr

50 μm

CsCl-NaCl

50 μm

RbCl-NaCl

50 μm

RbCl-NaF

50 μm (RbI85-CsI15)-NaCl

50 μm (RbI80-RbBr20)-NaCl

50 μm (CsBr80-CsI20)-NaCl

50 μm (CsBr50-CsI50)-NaCl

50 μm (CsBr80-RbBr20)-NaCl

50 μm (CsBr80-CsCl20)-NaCl

50 μm (CsBr60-CsCl40)-NaCl (RbBr95-RbI5)-NaCl (RbBr50-RbI50)-NaCl (RbBr90-CsBr10)-NaCl

50 μm

50 μm

50 μm

50 μm

50 μm

US 8,674,309 B2

SCINTILLATOR CRYSTAL BODY, METHOD FOR MANUFACTURING THE SAME, AND RADIATION DETECTOR

TECHNICAL FIELD

The present invention relates to a scintillator crystal body, a method for manufacturing the same, and a radiation detector, and more particularly relates to a scintillator crystal body which emits light by radiation, a method for manufacturing the same, and a radiation detector using the above scintillator crystal body.

BACKGROUND ART

In an x-ray CT (computed tomography) apparatus used in medical sites and the like, x rays passing through a photographic object are received by scintillators, and photodetectors detect light emitted therefrom. In addition, these detectors are disposed to form a two-dimensional array, and the scintillators are separated from each other by partitions so as not to cause crosstalk of light.

Since having no contribution to the x-ray detection and degrading a spatial resolution, the partitions are each preferably formed as thin as possible. For example, in PTL 1, a technique has been disclosed in which after many scintillator crystals are bonded to each other with an adhesive to form a scintillator array, the adhesive is removed by etching, and spaces formed thereby are filled with a titanium oxide powder functioning as a partition material. In this case, according to the above patent literature, the thickness of the partition can be decreased to approximately 1 μm.

Since a related scintillator has no function to guide light therethrough, partitions functioning as a scattering surface and/or a reflection surface are required. However, by the technique disclosed in PTL 1, although the thickness of the partition can be decreased, the partition itself cannot be eliminated. In addition, in a manufacturing process, many steps, for example, from cutting of a scintillator to bonding for partition formation are required.

CITATION LIST

Patent Literature

PTL 1 Japanese Patent Laid-Open No. 2008-145335

SUMMARY OF INVENTION

The present invention was made in consideration of the related techniques described above and provides a scintillator crystal body which is able to guide light and a method for manufacturing the same.

In addition, the present invention also provides a radiation detector using a scintillator crystal body which is able to guide light.

Solution to Problem

A scintillator crystal body which solves the problems described above comprises a phase separation structure which includes a first crystal phase and a second crystal phase having a refractive index larger than that of the first crystal phase and which has a first principal surface and a second principal surface, these two principal surfaces being not located on the same plane. In the scintillator crystal body described above, the first principal surface and the second principal surface have portions at which the second crystal phase is exposed, and a portion of the second crystal phase exposed to the first principal surface and a portion of the second crystal phase exposed to the second principal surface are connected to each other.

A method for manufacturing a scintillator crystal body which solves the above problems has the steps of: mixing a material forming a first crystal phase and a material forming a second crystal phase; then melting the material forming a first crystal phase and the material forming a second crystal phase; and then solidifying the material forming a first crystal phase and the material forming a second crystal phase along one direction to form a eutectic compound.

A radiation detector which solves the problems described above has the scintillator crystal body described above and a photodetector, and this scintillator crystal body is disposed so that the first principal surface or the second principal surface faces the photodetector.

Advantageous Effects of Invention

According to the present invention, a scintillator crystal body which is able to guide light and a method for manufacturing the same can be provided. In addition, the present invention can provide a radiation detector using a scintillator crystal body which is able to guide light.

According to the present invention, since the scintillator crystal body itself has a function to guide light, a related manufacturing process including the steps from cutting of a scintillator to partition formation is not required. In addition, a radiation detector having high use efficiency of light can be provided only by disposing the scintillator crystal body on a photodetector array.

DESCRIPTION OF EMBODIMENTS

Figure 1A:
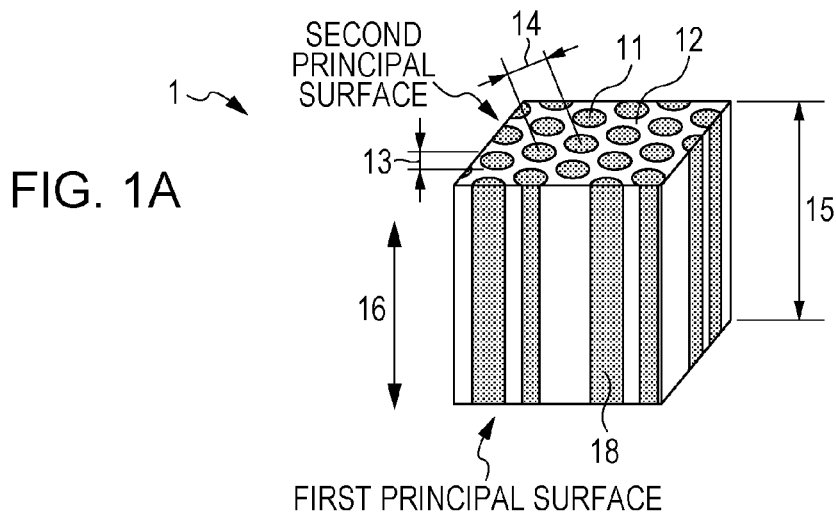
FIGS. 1A to 1C are each a perspective view showing one embodiment of a scintillator crystal body of the present invention.

Hereinafter, embodiments for carrying out the present invention will be described with reference to the drawings and the like. Although there are various modes (various configurations and various materials) as the embodiments for carrying out the present invention, the common features in all the embodiments are that a scintillator crystal body has a phase separation structure which includes two phases, that is, a first crystal phase and a second crystal phase having a larger refractive index than that of the first crystal phase, and which has a first principal surface and a second principal surface, these two principal surfaces not being located on the same plane; the first principal surface and the second principal surface have portions to which the second crystal phase is exposed; and a portion of the second crystal phase exposed to the first principal surface and a portion of the second crystal phase exposed to the second principal surface are connected to each other. Accordingly, light inside the crystal phase having a high refractive index is totally reflected by the crystal phase having a low refractive index located around the high refractive-index crystal phase, and as a result, the light travels in the high refractive-index crystal phase while being guided. At this stage, since the crystal phase having a high refractive index is exposed to the first principal surface and the second principal surface, and these exposed portions are connected to each other, the waveguide (light guide) is performed toward the first principal surface or the second principal surface. In other words, this phenomenon may be described such that light generated in the scintillator crystal body travels toward the first principal surface or the second principal surface while being confined in the second crystal phase (that is, light is prevented from spreading). As described above, in all the embodiments of the present invention, the scintillator crystal body itself has a waveguide function (light guide function).

In addition, in each embodiment which will be described hereinafter, the structure is preferably formed so that the first crystal phase which is a low refractive-index phase also has portions exposed to the first principal surface and the second principal surface, and these exposed portions are connected to each other. By the structure described above, light in the second crystal phase can be more reliably guided (optically guided) to the first principal surface or the second principal surface without being spread.

In addition, the structure is preferably formed so that the first crystal phase which is a low refractive-index phase is located in the second crystal phase which is a high refractive-index phase. By the structure described above, a sufficient waveguide function (light guide function) can be obtained while the volume ratio of the first crystal phase in the scintillator crystal body is reduced.

Hereinafter, each embodiment will be described.

First Embodiment

Columnar Crystal Structure in which a Primary Component of a Second Crystal Phase is a Scintillator Material (CsI)

FIG. 1A is a perspective view showing a first embodiment of a scintillator crystal body of the present invention. In the scintillator crystal body having a phase separation structure which includes two phases according to this embodiment shown in FIG. 1A, a first principal surface and a second principal surface have portions to which a second crystal phase is exposed, and a portion of the second crystal phase exposed to the first principal surface and a portion of the second crystal phase exposed to the second principal surface are connected to each other. In the embodiment shown in FIG. 1A, a first crystal phase formed of many columnar crystals having a unidirectional characteristic is present in the second crystal phase. In particular, the phase separation structure includes two phases, that is, a first crystal phase 11 and a second crystal phase 12 that is filled between side surfaces of the columnar crystals of the first crystal phase 11. Incidentally, the phase separation structure is a structure containing a plurality of separated phases which is obtained when a uniform state is changed. The phase separation structure of this embodiment is a structure obtained in such a way that when a uniform liquid state having no concrete structure in which constituent materials are melted is changed to a solid state, two crystal phases are simultaneously crystallized to have a certain periodicity.

Besides a circle, an ellipse, and a quadrangle cross-sectional shape, a cross-sectional shape of a columnar crystal 18 forming the first crystal phase 11 may be formed of a plurality of crystal planes to have a polygonal shape. In addition, a diameter 13 of the columnar crystal 18 is in a range of 50 nm to 30 μm and preferably in a range of 200 nm to 10 μm. In addition, a period 14 of the columnar crystal 18 of the first crystal phase is in a range of 500 nm to 50 μm and preferably in a range of 1 to 20 μm. However, when a scintillator crystal body and a photodetector or a photodetector array are used in combination, structural sizes thereof are preferably combined with each other so that many columnar crystals are arranged on a light receiving region of the photodetector. For example, when the shape of the light receiving region is a square having a 20-μm side, the columnar crystal preferably has a structural size in which the diameter is 5 μm and the period is 8 μm. Hence, in accordance with the size of the light receiving region, apart from the range of the structural size described above, columnar crystals having a small structural size are preferably used in combination. In addition, the range of the structural size is determined by the selection of material systems and the manufacturing conditions, and the tendency thereof will be described later.

Although depending on a manufacturing method, a thickness 15 of the scintillator crystal body can be adjusted to an arbitrary thickness. Since the scintillator crystal body detects radiation, the thickness of the crystal body must be sufficient to absorb its energy. For example, in the case of CsI which is a primary constituent material of the scintillator crystal body, a radiation length is 1.86 cm (distance at which the incident energy is reduced to 1/e) in a high energy region. Since it is calculated that 100% of energy is absorbed by 21 times the radiation length (39.06 cm), a sufficient thickness of the scintillator crystal body is 40 cm or less.

For example, in consideration of medical use in which a scintillator crystal body is frequently used in a low energy region of 1 MeV or less, the thickness 15 of the scintillator crystal body is in a range of 1 μm to 10 cm and preferably in a range of 10 μm to 10 mm. In addition, since the thickness varies depending on the set value of absorption coefficient of radiation, a scintillation crystal body having a thickness out of the range described above may also be used in some cases.

Although preferably extending straight in a thickness direction 16, the columnar crystals may be interrupted, branched, or fused and may include a curved portion besides the straight portion, and in addition, the diameter portion of the columnar crystal may be partially changed. When the direction of a solid-liquid interface in solidification is appropriately controlled, the columnar crystal can be curved.

The first crystal phase is preferably formed of a material containing NaBr (sodium bromide), NaCl (sodium chloride), NaF (sodium fluoride), or KCl (potassium chloride). In addition, NaCl is more preferable. The content of NaBr, NaCl, NaF, or KCl contained in the first crystal phase is 50 percent by mole or more and preferably in a range of 80 to 100 percent by mole.

The second crystal phase preferably contains CsI (cesium iodide) as a primary component. In this embodiment, the primary component of the second crystal phase indicates a material, the content of which is 50 percent by mole or more, and this primary component is preferably contained in an amount of 80 to 100 percent by mole in the second crystal phase.

When this primary component is CsI, as materials contained in the second crystal phase besides CsI, RbI (rubidium iodide), CsBr (cesium bromide), and RbBr (rubidium bromide) are preferable. More preferably, when CsI and RbI are contained in the second crystal phase, the ratio of RbI to CsI is preferably in a range of more than 0 to 20 percent by mole. Even more preferably, the ratio is 15 percent by mole or less. As in the case described above, when CsBr is contained, the ratio of CsBr to CsI is preferably in a range of more than 0 to less than 50 percent by mole. More preferably, the ratio is 20 percent by mole or less. As in the case described above, when RbBr is contained, the ratio of RbBr to CsI is preferably in a range of more than 0 to 10 percent by mole. In this case, although at most less than 50 percent by mole of CsBr may be added to CsI as a primary component, when more than 20 percent by mole of RbI or more than 10 percent by mole of RbBr is added, the transmittance of the crystal body along the columnar crystal is remarkably decreased. The reason for this is believed that a solid phase separation occurs, that is, an RbI or an RbBr component which cannot be solid-solved in CsI in the second crystal phase is precipitated.

In the selection of the above material systems, the importance of the scintillator crystal body of the present invention is the composition of materials for the first and the second crystal phases. The composition of materials forming the first and the second crystal phases contained in the scintillator crystal body of the present invention is preferably a composition at a eutectic point. The eutectic point is a point in an equilibrium diagram at which a eutectic reaction occurs and at which two types of solid solutions are simultaneously discharged from a liquid phase and solidification is completed.

In particular, the composition ratio of a preferable combination of the material system between the first and the second crystal phases of this embodiment is shown in the following Table 1.

TABLE 1

| FIRST CRYSTAL PHASE: SECOND CRYSTAL PHASE | EUTECTIC COMPOSITION [mol %] | EUTECTIC POINT [° C.] |
| --- | --- | --- |
| NaBr:CsI | 40:60 | 432 |
| NaCl:CsI | 30:70 | 490 |
| NaF:CsI | 5:95 | 599 |
| KCl:CsI | 40:60 | 447 |

Although equilibrium diagram data of the materials shown in Table 1 was not available, the equilibrium diagram thereof was developed through intensive research carried out by the present inventors using Differential Thermal Analysis (DTA) and the like. In order to obtain an excellent phase separation structure as shown in FIG. 1A, in general, the above compositions are preferably used. These compositions correspond to the respective eutectic points. However, the above composition must not be strictly controlled, and an acceptable range of ±4 percent by mole is preferably set for the composition. The acceptable range is more preferably ±2 percent by mole. The reason the acceptable range is limited to the vicinity of the composition as described above is that the phases have a eutectic relationship therebetween even in the structure formation and that in the vicinity of the eutectic composition, an excellent structure as shown in FIG. 1A can be obtained by unidirectional solidification. In other composition ranges, that is, when the composition is deviated by more than 2 percent by mole, one phase precipitates first, and in view of the structure formation, the structure is disordered. However, since the eutectic composition of Table 1 also includes a measurement error, although it is conceptionally important that the acceptable range of the eutectic composition be ±2 percent by mole, if an excellent structure is substantially obtained, a deviation of approximately ±4 percent by mole from the eutectic composition may also be accepted. In addition, since also including a measurement error and the like, the eutectic point shown in Table 1 indicates a temperature in the vicinity of the eutectic point and does not limit anything.

Next, the first and the second crystal phases may contain at least one component other than those mentioned above, and in particular, the component contained in the material forming the first crystal phase 11 is preferably a component which is solid-solved in the first crystal phase 11 and which is not solid-solved in the second crystal phase 12. For example, NaBr may be added to NaCl, or KCl may be added to NaCl. Furthermore, the component contained in the material forming the second crystal phase 12 is preferably a component which is not solid-solved in the first crystal phase 11 and which is solid-solved in the second crystal phase 12. For example, as described above, RbI may be added to CsI. In addition, when the primary component of the second crystal phase 12 is CsI, and one of RbI, CsBr, and RbBr is added thereto to form the second crystal phase, a composition having a eutectic relationship with the material composition forming the second crystal phase is preferably used.

At least one material other than RbI, CsBr, and RbBr may be additionally added to the second crystal phase 12. In addition, as long as the formation of the phase separation structure is not disturbed, at least one component which is solid-soluble in both phases may be added. The purpose of the addition of at least one material in an amount of 1 percent by mole or more other than the addition of an ultra small amount of a luminescence center which will be described later is to control the lattice constant and/or the band gap and further is to control a luminescent color and the like.

In the phase separation structure of this embodiment, the second crystal phase 12 containing a scintillator material as a primary component is excited by radiation irradiation and emits light. However, the case is not limited to that described above, and in the present invention, at least one of the first crystal phase and the second crystal phase may emit light by radiation excitation, and it is more preferable when the two crystal phases emit light. Hence, when CsI is used as a primary component of the second crystal phase, it is preferable that NaBr, NaCl, NaF, and KCl, each of which forms the first crystal phase 11, also emit light although the radiation absorption ability thereof is inferior to that of CsI. In particular, in order to increase the luminous efficiency, a small amount of a component functioning as the luminescence center is preferably added to base materials forming the first crystal phase 11 and the second crystal phase 12. However, when only reflection and refraction of light are taken into consideration, it is important that the second crystal phase which is at a high refractive-index side at least emits light by radiation, and the reason the low refractive-index side is allowed to emit light is based on a relatively high probability of generation of effects, such as scattering, and is not based on the light guide property. In addition, the case described above in which the two crystal phases emit light does not exclude the case in which the second crystal phase absorbs light emitted from the first crystal phase and the case opposite thereto. Furthermore, the case described above in which the two crystal phases emit light also does not exclude the case in which before emitting light, carriers generated in the first crystal phase enter the second crystal phase by diffusion and the case opposite thereto.

As the luminescence center, a large number of luminescence centers may be selected in accordance with applications and the like, and a single element or a plurality of elements may be added. For example, Cu, Ag, Au, Ga, In, Tl, Sn, Pb, Sb, and Bi, each of which has an $(ns)^2$ electron configuration in an alkaline halide, and Ce, Pr, Nd, Sm, Eu, Gd, Tb, Dy, Ho, Er, Tm, Yb, and Lu, each of which is a rare earth element, are preferably selected. In addition, Na may also be selected. In view of high luminance, as the luminescence center of the scintillator crystal body, at least one of Tl, In, and Ga is more preferably contained. When the above luminescence center is added, in accordance with applications, the element may be appropriately selected in consideration of desired luminance, luminescence wavelength, luminescent decay time, and the like. In addition, when added as described above, for example, the luminescence center is easily added to one of the two phases due to the phase separation structure, and concentration distribution may be generated in some cases; however, no problems may arise thereby. The luminescence by radiation described in the present invention also includes, besides general scintillation (luminescence by radiation irradiation), photostimulated phosphorescence (trap sites of carriers generated by radiation irradiation are excited by light irradiation, and light is emitted thereby).

As the important property of the phase separation scintillator crystal body having a unidirectional characteristic of the present invention, the light guide may be mentioned. The refractive indices of the material systems forming the first crystal phase 11 and the second crystal phase 12 are shown in Table 2.

TABLE 2

| MATERIAL SYSTEM | REFRACTIVE INDEX OF FIRST CRYSTAL PHASE | REFRACTIVE INDEX OF SECOND CRYSTAL PHASE | REFRACTIVE INDEX RATIO OF FIRST CRYSTAL PHASE/SECOND CRYSTAL PHASE |
|---|---|---|---|
| NaBr:CsI | 1.64 | 1.80 | 0.911 |
| NaCl:CsI | 1.55 | 1.80 | 0.861 |
| NaF:CsI | 1.32 | 1.80 | 0.733 |
| KCl:CsI | 1.49 | 1.80 | 0.828 |

For example, since the refractive index shown in Table 2 has wavelength dependence and is changed by an additive, the value thereof is not strict, and Table 2 is to show the difference in refractive index (shown by ratio in the table) between constituent materials. According to Snell's law, between materials having different refractive indices, if light enters a low refractive-index medium at a certain angle from a high refractive-index medium, total reflection occurs, and at an angle smaller than that, reflection and refraction occur. Hence, in the phase separation scintillator crystal body of the present invention, the generation of difference in the refractive index shown in Table 2 indicates that light is not spread in the high refractive-index medium by total reflection under some conditions. That is, since refraction and reflection are repeatedly performed, the high refractive-index medium is more likely to relatively confine and transmit light. Hence, the refractive-index ratio (low refractive-index crystal phase/high refractive-index crystal phase) is preferably at least less than 1. In addition, when only the total reflection condition is taken into consideration, it indicates that as the ratio of low refractive index/high refractive index is smaller, light is more difficult to spread. When only the refractive index is taken into consideration, as apparent from Table 2, the combination of NaF with CsI is most preferable, and KCl, NaCl, and NaBr are preferable in this order.

However, in this embodiment, CsI functioning as a high refractive-index medium forms the second crystal phase 12. That is, since the second crystal phase forms a matrix around the columnar crystals in this embodiment, when the composition ratio (see Table 1) of the first crystal phase 11 forming the columnar crystals is low (for example, NaF: 5 percent by mole), light tends to pass between sides of the columnar crystals and to easily spread. In addition, when the composition ratio of the first crystal phase is high (for example, NaCl: 30 percent by mole), since the ratio of the second crystal phase formed of CsI having a high x-ray response is decreased, the luminous quantity is liable to relatively decrease. Hence, in consideration of the combination between the above two effects, among the above 4 types of material systems, NaCl is more preferably used to form the first crystal phase 11 in view of the light guide. However, in consideration of the luminous efficiency by radiation excitation and the like, whether the combination is good or bad should be determined in accordance with each application; hence, whether the combination is good or bad is not simply determined by the refractive-index ratio and the composition ratio, and the above material systems are all important.

As described above, the phase separation scintillator crystal body of the present invention is characterized in that light is guided in a direction parallel to the height direction of the columnar crystal (direction between the first principal surface and the second principal surface) and is not guided in a direction perpendicular thereto, for example, by scattering and reflection. Accordingly, the crosstalk of light can be suppressed without forming partitions in a single crystal group as in the related technique.

Second Embodiment

Columnar or Lamella Structure in which a Primary Component of a Second Crystal Phase is a Scintillator Material (NaI)

Figure 1B:
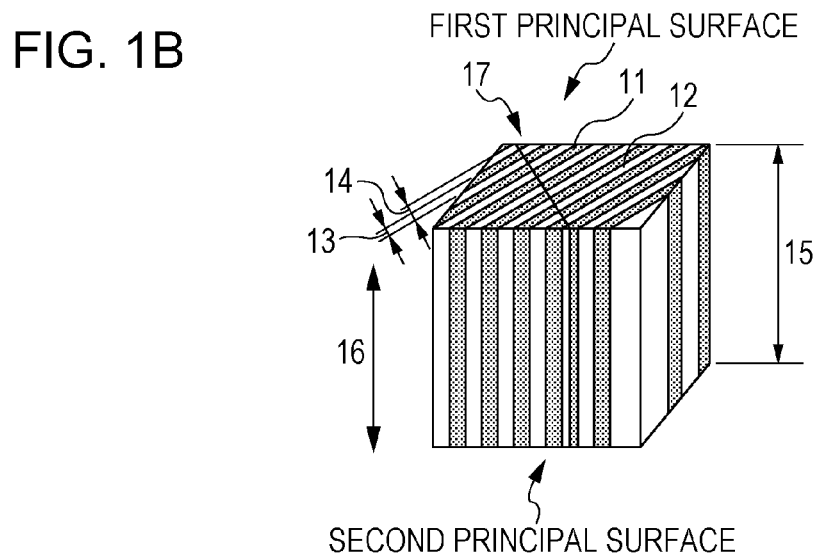

Next, a second embodiment will be described. In the second embodiment, NaI (sodium iodide) is used as a primary component of the second crystal phase, and a phase separation structure of the columnar crystal structure shown in FIG. 1A or FIG. 1C or a lamella structure shown in FIG. 1B is obtained. Hereinafter, these structures will be described in detail.

Figure 1C:
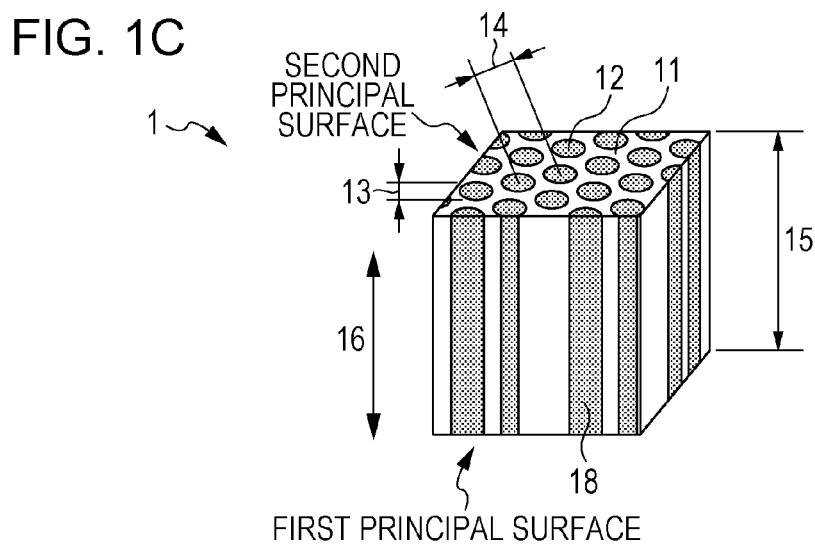

FIGS. 1A, 1B, and 1C are each a perspective view showing one mode of a scintillator crystal body of this embodiment. The structure shown in FIG. 1A is similar to that in the above first embodiment, and hence a description thereof will be partially omitted. In addition, the structure as shown in FIG. 1A in which two phases, that is, a first crystal phase 11 formed of many columnar crystals having a unidirectional characteristic and a second crystal phase 12 which is filled between side surfaces of the columnar crystals of the first crystal phase 11, are formed is hereinafter called a first configuration. In addition, the structure as shown in FIG. 1B in which a first crystal phase 11 and a second crystal phase 12 are each formed of plate crystals standing in one direction and are alternately disposed in close contact with each other is hereinafter called a second configuration. Furthermore, the structure as shown in FIG. 1C in which two phases, that is, a second crystal phase 12 formed of many columnar crystals having a unidirectional characteristic and a first crystal phase 11 which is filled between side surfaces of the columnar crystals of the second crystal phase 12, are formed is hereinafter called a third configuration.

A diameter 13 of the first crystal phase in the first configuration shown in FIG. 1A or a diameter 13 of the second crystal phase in the third configuration shown in FIG. 1C and a period 14 in FIGS. 1A and 1C are preferably in the same ranges as those described in the first embodiment. In addition, also in the second configuration shown in FIG. 1B, although the crystal phase includes the plate crystals, when the diameter and the period are defined by a shorter-side side, a diameter 13 and a structural period 14 of the plate crystals of the first crystal phase are preferably in ranges similar to those of the first configuration.

In addition, when the scintillator crystal body of this embodiment is used in combination with a photodetector or a photodetector array, as described in the first embodiment, structure sizes thereof are preferably combined with each other so that a plurality of columnar crystals or a plurality of plate crystals is arranged on a light receiving region of the photodetector. In the case of the plate crystal in the second configuration, the shorter-side side thereof may have a size similar to that of the columnar crystal. However, as for a longer-side side of the plate crystal, in accordance with the application, the size of a region surrounded by a first domain boundary 17 shown in FIG. 1B and a second domain boundary 17 (not shown) is preferably equal to or smaller than that of a light receiving region of a detection pixel. The reason the size as described above is preferable is that light propagating along the longer-side side may not travel toward a detector side and may spread in a lateral direction in some cases. However, when the light guide property at the shorter-side side and that at the longer-side side are known in advance in association with the detector array, correction may be performed after an image pick-up by the detector array, and hence, even when the size surrounded by the domain boundaries is larger than that of the detection pixel, the advantages of the present invention may not always be obtained. The scintillator crystal body may have a preferable light guide property at least at the shorter-side side.

A thickness 15 of the scintillator crystal body is similar to that of the first embodiment.

Although this embodiment is realized when the second crystal phase contains NaI as a primary component, CsI, RbI, NaCl or NaF is more preferably contained as the first crystal phase. This indicates that when a material forming the first crystal phase is a material system which has a eutectic relationship with NaI, the structure of this embodiment is preferably formed. One example of the available relationship between the material of the first crystal phase and that of the second crystal phase is as shown in Table 3. That is, in the case of the combination between NaI and CsI, the second configuration (FIG. 1B) is formed, the second crystal phase is NaI, and the first crystal phase is CsI. In addition, in the case of the combination between NaI and RbI, the third configuration (FIG. 1C) is formed, the second crystal phase is NaI, and the first crystal phase is RbI. In the case of the combination between NaI and NaCl, the first configuration (FIG. 1A) is formed, the first crystal phase is NaCl, and the second crystal phase is NaI. Furthermore, in the case of the combination between NaI and NaF, the second configuration (FIG. 1B) is formed, the second crystal phase is NaI, and the first crystal phase is NaF.

TABLE 3

| COMBINATION OF MATERIALS | CONFIGURATION | FIRST CRYSTAL PHASE | SECOND CRYSTAL PHASE |
| --- | --- | --- | --- |
| CsI—NaI | SECOND CONFIGURATION | CsI | NaI |
| RbI—NaI | THIRD CONFIGURATION | RbI | NaI |
| NaCl—NaI | FIRST CONFIGURATION | NaCl | NaI |
| NaF—NaI | SECOND CONFIGURATION | NaF | NaI |

Next, in the selection of the above material systems, the composition of the materials forming the first crystal phase and the second crystal phase is important in this embodiment.

In the four types of combinations of the material systems of this embodiment shown in Table 3, preferable composition ratios are as shown in the following table 4, and the compositions are each preferably a composition at a eutectic point.

TABLE 4

| FIRST CRYSTAL PHASE: SECOND CRYSTAL PHASE | EUTECTIC COMPOSITION [mol %] | EUTECTIC POINT [° C.] |
|---|---|---|
| CsI:NaI | 51:49 | 428 |
| RbI:NaI | 50:50 | 505 |
| NaCl:NaI | 40:60 | 573 |
| NaF:NaI | 18:80 | 596 |

As in the case of the above first embodiment, the acceptable range of the above composition is preferably ±4 percent by mole and is more preferably ±2 percent by mole.

As described in the first embodiment, at least one material other than those described above may also be added to the first crystal phase and the second crystal phase. For example, it is preferable that KI is added to NaI, RbI is added to CsI, and CsI is added to RbI. As long as the structure formation is not disturbed, at least one material solid-soluble in the two crystal phases may be added. In addition, the content of one of NaI, CsI, RbI, NaCl, and NaF, each of which is a material forming a corresponding crystal phase, is set to 50 percent by mole or more and is preferably set in a range of 80 to 100 percent by mole.

Since NaI which is a scintillator material is used for the second crystal phase of the phase separation structure in this embodiment, when NaI is excited by radiation irradiation, light can be emitted. Although at least one crystal phase preferably emits light in this embodiment, it is more preferable when the two crystal phases both emit light. In particular, in order to increase the luminous efficiency, a small amount of at least one element functioning as the luminescence center (hereinafter simply referred to as "luminescence center") is preferably added to base materials forming the first crystal phase 11 and the second crystal phase 12. As the luminescence center, elements similar to those described in the first embodiment may also be used.

As the important property of the phase separation scintillator having a unidirectional characteristic of this embodiment, the light guide may be mentioned. The refractive indices of the material systems forming the first crystal phase 11 and the second crystal phase 12 are shown in Table 5.

TABLE 5

| COMBINATION OF MATERIALS | REFRACTIVE INDEX OF FIRST CRYSTAL PHASE | REFRACTIVE INDEX OF SECOND CRYSTAL PHASE | RATIO OF LOW REFRACTIVE INDEX/HIGH |
|---|---|---|---|
| CsI—NaI | 1.80 | 1.85 | 0.973 |
| RbI—NaI | 1.61 | 1.85 | 0.870 |
| NaCl—NaI | 1.55 | 1.85 | 0.838 |
| NaF—NaI | 1.32 | 1.85 | 0.714 |

When only the total reflection condition is taken into consideration, as the ratio of low refractive index/high refractive index is smaller, light is more difficult to spread. Hence, when the judgment is performed only by the refractive index, it is apparent from this table that light is most unlikely to spread in the NaF—NaI system, and light is unlikely to spread in NaCl—NaI, RbI—NaI, and CsI—NaI systems in this order.

However, as described in the first embodiment, when the volume of the low refractive-index material forming the first crystal phase is small, the visibility at the high refractive-index side becomes good, and light tends to easily pass through and spread in a lateral direction. Although the situation as described above may also occur in the NaCl—NaI (first configuration) and the CsI—NaI (second configuration) systems, it does not indicate that the light guide effect is not obtained therein, and although light is sufficiently guided as compared to the case of a NaI single crystal, the effect is not so good as that of the other material systems of this embodiment. Although the NaF—NaI system belongs to the second configuration, since the form of NaF is frequently branched into three ways, the visibility at the high refractive-index side is inferior to that of the CsI—NaI system, and light is unlikely to pass through in a lateral direction. In the case in which NaI forms columnar crystals, that is, in the RbI—NaI system which is the third configuration, since light travels in the columnar crystal, in this configuration, light is difficult to spread in a lateral direction. As described above, the ability of light guide is not determined only by the ratio of the refractive index (difference in refractive index between a low refractive-index material and a high refractive-index material).

On the other hand, since light is emitted by radiation irradiation, although depending on the luminescence mechanism and/or the additive functioning as the luminescence center, radiation blocking capability of CsI is most high and is followed by RbI, NaI, NaCl, and NaF in this order. As a result, when Tl is assumed as the luminescence center, CsI, RbI and NaI well emit light. Hence, as the material system for the phase separation scintillator, the CsI—NaI and the RbI—NaI systems are both advantageous since light is well emitted and a high signal strength can be obtained. Under the condition described above, in general, the radiation blocking capability in consideration of the composition ratio is high in the order of CsI—NaI, RbI—NaI, NaF—NaI, and NaCl—NaI. However, since the radiation blocking capability has energy dependence, it may not be concluded in some cases that the radiation blocking capability is high in the order of CsI, RbI, NaI, NaCl, and NaF.

Another significant property of this embodiment is a short luminescent decay time of NaI:Tl and the like. In particular, NaI:Tl generally has a decay time (time to decay from the initial luminance to 1/e) of approximately 200 nsec (nano seconds) and is preferably used, for example, for a CT apparatus which obtains many images at a high speed. As a comparative example, the luminescent decay time of CsI:Tl is approximately 500 ns which is approximately 2.5 times that of NaI:Tl. The luminescent decay time of the material system of the present invention is shown in Table 6.

TABLE 6

| MATERIAL SYSTEM | LUMINESCENT DECAY TIME |
|---|---|
| NaI—CsI | 280 ns; 545 ns |
| NaI—RbI | 178 ns; 310 ns |
| NaCl—NaI | 135 ns; 273 ns |
| NaI—NaF | 153 ns; 429 ns |

Since the material system of this embodiment is separated into two phases, the luminescent decay times corresponding to the two phases are obtained. This result is reasonably satisfactory since the fitting of the two components is well converged to the measurement data. When attention is paid to a long decay time of a material of each system shown in Table 6 (for example, the decay time of CsI of the CsI—NaI system), it is found that the decay time is increased in the order of NaCl—NaI, RbI—NaI, NaF—NaI, and CsI—NaI. Since the correspondence between the two phases and the two decay times in each system is not clear, FIG. 6 only shows that the two decay time constants are present as an entire system.

Finally, the whole is summarized in Table 7.

TABLE 7

| MATERIAL SYSTEM | CONFIGURATION | REFRACTIVE INDEX RATIO (ORDER FROM SMALL VALUE) | RADIATION BLOCKING CAPABILITY (ORDER FROM HIGH VALUE) | LUMINESCENT DECAY TIME (ORDER FROM SHORT VALUE) |
|---|---|---|---|---|
| NaI—CsI | (3) | (4) | (1) | (4) |
| NaI—RbI | (1) | (3) | (2) | (2) |
| NaCl—NaI | (2) | (2) | (4) | (1) |
| NaI—NaF | (2) | (1) | (3) | (3) |

The number of each column in the table indicates the rank. The rank in the column of configuration indicates the light guide performance, that is, (1) the third configuration in which a high refractive-index material forms columnar crystals is ranked best; (2) the first configuration in which a low refractive-index material forms columnar crystals and (2) the specific second configuration (for example, being branched into three ways) are ranked at the same level; and (3) the second structure which is not specific is slightly inferior to the other configurations.

When all the data are evaluated as a whole, it is found that the RbI—NaI system is averagely good in every column and that the NaF—NaI system is also excellent in terms of the configuration and the refractive index ratio. As described above, it is preferable that in accordance with the performance or the like which is thought important, a suitable system is determined and is selected for the use.

As described above, the phase separation scintillator crystal body containing NaI of this embodiment has the properties in which light is guided along a direction parallel to the columnar crystals or the plate crystals and is not guided in a direction perpendicular thereto, for example, by scattering and reflection. Hence, the crosstalk of light can be suppressed without forming partitions in a single crystal group as in the related technique.

Third Embodiment

Columnar or Lamella Structure in which a Primary Component of a Second Crystal Phase is not Limited to a Scintillator Material Next, a third embodiment will be described. The third embodiment is a mode in which a primary component of a second crystal phase is not limited to a scintillator material. In this embodiment, NaBr or NaCl is used as a material which is not a scintillator material. In addition, a scintillator material may also be used, and in this case, RbI, CsBr, RbBr, CsCl, or RbCl is used in this embodiment. A phase separation structure of a columnar crystal structure shown in FIG. 1A or 1C or a lamellar crystal structure shown in FIG. 1B is obtained using one of the above materials as a primary component of the second crystal phase. This structure will be described in detail. Since the configurations shown in FIGS. 1A, 1B, and 1C are already described in the above embodiments, in particular, in the second embodiment, descriptions thereof will be omitted, and only the features of this embodiment will be described in detail. Although depending on a manufacturing method, a thickness 15 of a scintillator crystal body can be adjusted to a desired thickness. In order to detect radiation, it is important that the thickness is large enough to absorb the energy thereof. For example, as the radiation length of the primary constituent material in the case of a high energy region, RbI is 2.7 cm, CsBr is 2.1 cm, RbBr is 3.4 cm, CsCl is 2.4 cm, and RbCl is 4.6 cm. Since 21 times the radiation length of RbCl (96.6 cm) is used as a rough indication to absorb 100% of energy, in the case in which the thickness is most increased, a thickness 15 of 97 cm or less is sufficient. Incidentally, the radiation length is an average distance necessary to decrease incident energy to 1/e.

In medical use in which a scintillator is frequently used in a low energy region of 1 MeV or less, for example, the thickness 15 is in a range of 1 μm to 15 cm and preferably in a range of 10 μm to 30 mm. Since being influenced by a set value of the absorption coefficient of radiation, the thickness is not limited to the range described above.

This embodiment is realized when at least one phase uses as a primary component one of RbI, CsBr, RbBr, CsCl, and RbCl, each of which functions as a scintillator. As a more effective material system, one of NaF, NaCl and NaBr is used in combination with one of RbI, CsBr, and RbBr. For example, a combination of NaCl with CsCl may be mentioned. In addition, a combination between RbCl and NaF or NaCl may also be mentioned. The above combinations indicate that in view of the structure formation of the present invention, a material system having a eutectic relationship can be selected. In addition, examples of available relationship between materials for the first crystal phase and those for the second crystal phase are as shown in Table 8. In this embodiment, the second crystal phase, which is a high refractive-index layer, may contain a material other than a scintillator material as a primary component in some cases. For example, in the case of the combination between RbI and NaBr, the second configuration (FIG. 1B) is formed, the second crystal phase, which is a high refractive-index phase, contains as a primary component NaBr which is not a scintillator material, and the first crystal phase contains as a primary component RbI which is a scintillator material.

TABLE 8

| COMBINATION OF MATERIALS | CONFIGURATION | FIRST CRYSTAL PHASE | SECOND CRYSTAL PHASE |
|---|---|---|---|
| NaF—RbI | FIRST CONFIGURATION | NaF | RbI |
| NaCl—RbI | FIRST CONFIGURATION | NaCl | RbI |
| RbI—NaBr | SECOND CONFIGURATION | RbI | NaBr |
| NaF—CsBr | FIRST CONFIGURATION | NaF | CsBr |
| NaCl—CsBr | FIRST CONFIGURATION | NaCl | CsBr |
| NaBr—CsBr | FIRST CONFIGURATION | NaBr | CsBr |
| NaF—RbBr | FIRST CONFIGURATION | NaF | RbBr |
| RbBr—NaCl | SECOND CONFIGURATION | RbBr | NaCl |
| RbBr—NaBr | THIRD CONFIGURATION | RbBr | NaBr |
| NaCl—CsCl | FIRST CONFIGURATION | NaCl | CsCl |
| NaF—RbCl | FIRST CONFIGURATION | NaF | RbCl |
| RbCl—NaCl | FIRST CONFIGURATION | RbCl | NaCl |

Next, in the selection of the above material systems, the composition of the material forming the first crystal phase and that forming the second crystal phase is important in the present invention.

Among the 12 types of combinations of the representative material systems shown in Table 8, desirable composition ratios are as shown in the following Table 9, and each combination is preferably composition at a eutectic point. The eutectic point is a point in an equilibrium diagram at which a eutectic reaction occurs and at which at least two types of crystals are simultaneously crystallized from a liquid phase and solidification is completed.

TABLE 9

| FIRST CRYSTAL PHASE: SECOND CRYSTAL PHASE | EUTECTIC COMPOSITION [mol %] | EUTECTIC POINT [° C.] |
| --- | --- | --- |
| NaF:RbI | 6:94 | 606 |
| NaCl:RbI | 35:65 | 482 |
| RbI:NaBr | 53:47 | 448 |
| NaF:CsBr | 6:94 | 595 |
| NaCl:CsBr | 40:60 | 463 |
| NaBr:CsBr | 41:59 | 465 |
| NaF:RbBr | 10:90 | 630 |
| RbBr:NaCl | 54:46 | 501 |
| RbBr:NaBr | 55:45 | 497 |
| NaCl:CsCl | 35:65 | 486 |
| NaF:RbCl | 15:85 | 624 |
| RbCl:NaCl | 56:44 | 550 |

As in the case of the first embodiment, the acceptable range of the above composition is preferably ±4 percent by mole and more preferably ±2 percent by mole.

In addition, as described in the first embodiment, at least one material other than those mentioned above may also be added to the first crystal phase and the second crystal phase. For example, NaBr may be added to NaCl, CsI or RbBr may be added to RbI, CsI, RbBr, or CsCl may be added CsBr, and RbI or CsBr may be added to RbBr. More preferably, when CsI or RbBr are added to RbI of a primary component, the ratio of CsI to RbI is in a range of more than 0 to 20 percent by mole, and the ratio of RbBr to RbI is in a range of more than 0 to less than 50 percent by mole. As in the described above, when CsI, RbBr, or CsCl are added to CsBr of a primary component, the ratio of CsI to CsBr is in a range of more than 0 to 50 percent by mole, and the ratio of RbBr to CsBr is in a range of more than 0 to 25 percent by mole, and the ratio of CsCl to CsBr is in a range of more than 0 to less than 50 percent by mole. As in the described above, when RbI, or CsBr are added to RbBr of a primary component, the ratio of RbI to RbBr is in a range of more than 0 to 50 percent by mole, and the ratio of CsBr to RbBr is in a range of more than 0 to 15 percent by mole. In this embodiment, since one of RbI, CsBr, RbBr, CsCl, and RbCl, each of which is a scintillator material, is also used in the phase separation structure, when the above material is excited by radiation irradiation, light can be emitted. Also in this embodiment, although at least one of the crystal phases preferably emits light, it is more preferable that the two crystal phases emit light. In particular, in order to increase the luminous efficiency, a small amount of at least one element functioning as the luminescence center (hereinafter simply referred to as "luminescence center") is preferably added to base materials forming the first crystal phase 11 and the second crystal phase 12. As the luminescence center, elements similar to those described in the first embodiment may also be used. As the important property of the phase separation scintillator having a unidirectional characteristic of the present invention, the light guide may be mentioned. The refractive indices of the material systems forming the first crystal phase 11 and the second crystal phase 12 are shown in Table 10.

TABLE 10

| COMBINATION OF MATERIALS | REFRACTIVE INDEX OF FIRST CRYSTAL PHASE | REFRACTIVE INDEX OF SECOND CRYSTAL PHASE | RATIO OF LOW REFRACTIVE INDEX/HIGH REFRACTIVE INDEX |
| --- | --- | --- | --- |
| NaF—RbI | 1.32 | 1.61 | 0.82 |
| NaCl—RbI | 1.55 | 1.61 | 0.963 |
| RbI—NaBr | 1.61 | 1.64 | 0.982 |
| NaF—CsBr | 1.32 | 1.71 | 0.772 |
| NaCl—CsBr | 1.55 | 1.71 | 0.906 |
| NaBr—CsBr | 1.64 | 1.71 | 0.959 |
| NaF—RbBr | 1.32 | 1.53 | 0.863 |
| RbBr—NaCl | 1.53 | 1.55 | 0.987 |
| RbBr—NaBr | 1.53 | 1.64 | 0.933 |
| NaCl—CsCl | 1.55 | 1.65 | 0.939 |
| NaF—RbCl | 1.32 | 1.53 | 0.863 |
| RbCl—NaCl | 1.53 | 1.55 | 0.987 |

When only the total reflection condition is taken into consideration, as the ratio of low refractive index/high refractive index is smaller, light is more difficult to spread. Hence, when judgment is performed only by the refractive index, in the systems shown in Table 10, it is found that light is most unlikely to spread in CsBr—NaF. However, as for RbI—NaBr, RbBr—NaCl, RbBr—NaBr, and RbCl—NaCl shown in Table 10, an RbI, RbBr, and RbCl side functioning as a scintillator each form a low refractive index phase. Accordingly, since the phase emitting light by radiation excitation is different from the phase responsible for light guide, the performance thereof is inferior to the other combinations; however, since effects, such as, scattering, may be generated at a relatively high probability, the above combination has an excellent light guide function compared to a single-phase scintillator crystal body.

In addition, when CsBr which has the highest refractive index in Table 10 forms the second crystal phase of the first configuration, and as in the combination with NaF, when the volume of a low refractive index material forming the first crystal phase is small (determined by the composition ratio and the density), light is liable to pass through in a lateral direction and spread. In addition, in the case of the second configuration, light is also liable to pass through in a lateral direction and spread. This condition does not indicate that the effects of this embodiment cannot be obtained but indicates that although light is sufficiently guided as compared, for example, to the case of a CsBr single crystal, the performance is not so good as that of the other material systems of this embodiment. On the contrary, the third configuration, that is, the RbBr—NaBr system, can be considered as a configuration in which light in not likely to spread in a lateral direction. That is, since the high refractive-index second crystal phase containing NaBr as a primary component forms the columnar crystals, in a portion of light generated in the first crystal phase containing RbBr as a primary component, light incident on the second crystal phase formed of the columnar crystals is, for example, scattered, so that the traveling path of the light is changed; hence, in some cases, the light thus scattered is guided by a light guide function and is suppressed from spreading. As described above, the capability to guide light is not determined only by the ratio of the refractive index (difference in refractive index between a low refractive-index material and a high refractive-index material).

On the other hand, since light is emitted by radiation irradiation, although depending on the light emission mechanism and/or the additive functioning as the luminescence center, when x-ray energy is in a range of approximately 16 to 33 KeV, the linear attenuation coefficient of each of RbI, CsBr, RbBr, CsCl, and RbCl is approximately equal to that of CsI. In addition, the linear attenuation coefficient of each of the above materials except CsCl is higher than that of CsI, in order to emit high luminescent light, the materials are preferably used in the energy range described above.

As described above, the phase separation scintillator crystal body which contains RbI, CsBr, RbBr, CsCl, or RbCl as a primary component of this embodiment has features in which light is guided in a direction parallel to the columnar crystal or the plate crystal and is not guided in a direction perpendicular thereto, for example, by scattering and reflection. Accordingly, the crosstalk of light can be suppressed without forming partitions in a single crystal group as in the related technique.

Fourth Embodiment

Lamella Structure in which a Primary Component of a Second Crystal Phase is Formed of a Scintillator Material (Alkaline Earth Halide)

Next, a fourth embodiment will be described. In the fourth embodiment, an alkaline earth halide is used as a primary component of a second crystal phase, and a phase separation structure of the lamella structure shown in FIG. 1B is obtained. This phase separation structure will be described in detail. Since the structure shown in FIG. 1B is already described in the above embodiments, the features of this embodiment will only be described in detail.

A scintillator crystal body of this embodiment is a phase separation structure which includes a unidirectional first crystal phase and second crystal phase, and the second crystal phase is a formed of a material which contains as a primary component one of barium iodide ($BaI_2$), barium bromide ($BaBr_2$), barium chloride ($BaCl_2$), strontium bromide ($SrBr_2$), and strontium chloride ($SrCl_2$), each of which is alkaline earth halide. In addition, the feature of the scintillator crystal body is characterized in that at least one phase of the above structure emits light by radiation excitation.

As a preferable phase corresponding to the above second crystal phase, sodium iodide (NaI) is for barium iodide ($BaI_2$), sodium bromide (NaBr) is for barium bromide ($BaBr_2$), and sodium chloride (NaCl) is for barium chloride ($BaCl_2$). In addition, sodium bromide (NaBr) is preferable for strontium bromide ($SrBr_2$), and sodium chloride (NaCl) is preferable for strontium chloride ($SrCl_2$). However, since a phase separation structure is probably formed when a material system has a eutectic relationship with the above alkaline earth halide, other combinations are not excluded.

In addition, at least one of the first crystal phase and the second crystal phase preferably contains at least one of europium (Eu), cerium (Ce), thallium (Tl), indium (In), and gallium (Ga) as a luminescence center.

The composition of the first crystal phase and the second crystal phase is preferably a composition at a eutectic point. Examples of available relationships between materials for the first crystal phase and materials for the second crystal phase are as shown in Table 11.

TABLE 11

| COMBINATION OF MATERIALS | CONFIGURATION | FIRST CRYSTAL PHASE | SECOND CRYSTAL PHASE |
|---|---|---|---|
| NaI—$BaI_2$ | SECOND CONFIGURATION | NaI | $BaI_2$ |
| NaBr—$BaBr_2$ | SECOND CONFIGURATION | NaBr | $BaBr_2$ |
| NaCl—$BaCl_2$ | SECOND CONFIGURATION | NaCl | $BaCl_2$ |
| NaBr—$SrBr_2$ | SECOND CONFIGURATION | NaBr | $SrBr_2$ |
| NaCl—$SrCl_2$ | SECOND CONFIGURATION | NaCl | $SrCl_2$ |

Next, in the selection of the above material systems, the composition of the material forming the first crystal phase and the material forming the second crystal phase is important in this embodiment.

Among the five types of combinations of the material systems of this embodiment shown in Table 11, preferable composition ratios are as shown in the following Table 12, and the compositions are each preferably a composition at a eutectic point.

TABLE 12

| FIRST CRYSTAL PHASE: SECOND CRYSTAL PHASE | EUTECTIC COMPOSITION [mol %] | EUTECTIC POINT [° C.] |
|---|---|---|
| NaI—$BaI_2$ | 50:50 | 491 |
| NaBr—$BaBr_2$ | 60:40 | 600 |
| NaCl—$BaCl_2$ | 60:40 | 651 |
| NaBr—$SrBr_2$ | 40:60 | 457 |
| NaCl—$SrCl_2$ | 48:52 | 565 |

As in the first embodiment, the acceptable range of the above composition is preferably ±4 percent by mole and more preferably ±2 percent by mole. Since an alkaline earth halide which is a scintillator material is used for the second crystal phase of the phase separation structure of this embodiment, when being excited by radiation irradiation, the second crystal phase can be made to emit light. Although at least one of the crystal phases preferably emits light in this embodiment, it is more preferable that the two crystal phases emit light. In particular, in order to increase the luminous efficiency, a small amount of an element functioning as the luminescence center is preferably added to base materials forming the first crystal phase 11 and the second crystal phase 12. As the luminescence center, at least one of europium (Eu), cerium (Ce), thallium (Tl), indium (In), and the gallium (Ga) is preferably contained.

As the important property of the phase separation scintillator having a unidirectional characteristic of this embodiment, the optical guide may be mentioned. The refractive indices of the material systems each forming the first crystal phase 11 and the second crystal phase 12 are shown in Table 13.

TABLE 13

| MATERIAL SYSTEM | REFRACTIVE INDEX OF FIRST CRYSTAL PHASE | REFRACTIVE INDEX OF SECOND CRYSTAL PHASE | RATIO OF LOW REFRACTIVE INDEX/HIGH REFRACTIVE INDEX |
|---|---|---|---|
| NaI—$BaI_2$ | 1.85 | (2.0) | 0.925 |
| NaBr—$BaBr_2$ | 1.64 | (1.8) | 0.911 |
| NaCl—$BaCl_2$ | 1.55 | 1.64 | 0.945 |

TABLE 13-continued

| MATERIAL SYSTEM | REFRACTIVE INDEX OF FIRST CRYSTAL PHASE | REFRACTIVE INDEX OF SECOND CRYSTAL PHASE | RATIO OF LOW REFRACTIVE INDEX/HIGH REFRACTIVE INDEX |
|---|---|---|---|
| NaBr—SrBr$_2$ | 1.64 | (1.75) | 0.937 |
| NaCl—SrCl$_2$ | 1.55 | 1.65 | 0.939 |

As described above, the phase separation scintillator crystal body which contains an alkaline earth halide of this embodiment has features in which light is guided in a direction parallel to the plate crystal and is not guided in a direction parallel thereto, for example, by scattering and reflection. Accordingly, the crosstalk of light can be suppressed without forming partitions in a single crystal group as in the related technique.

Next, a method for manufacturing the scintillator crystal body of each of the above embodiments will be described. A method for manufacturing a scintillator crystal body according to this embodiment includes the steps of: mixing a material forming a first crystal phase and a material forming a second crystal phase; then melting a mixture of the material forming a first crystal phase and the material forming a second crystal phase; and then solidifying the material forming a first crystal phase and the material forming a second crystal phase along one direction to form a eutectic compound.

The method for manufacturing a scintillator crystal body of this embodiment can be realized by any method in which a desired material system having an optimal composition is melted and solidified to have a unidirectional characteristic. In particular, since it is required to control the temperature gradient to obtain a smooth solid-liquid interface, the control is preferably performed so that the temperature gradient at the solid-liquid interface of a mixture is 30° C./mm or more. However, in order to avoid cracks and the like caused by a thermal stress applied to the crystal, the temperature gradient may be decreased as long as the structure formation of each of the above embodiments is not disturbed. In addition, in order to suppress the generation of cracks and the like, reheating is preferably performed so as not to again melt a portion which is already formed into the crystal body. In addition, as for the formable composition range of the eutectic composition, ±4 percent by mole and preferably ±2 percent by mole of the eutectic composition are described; however, the present inventors believe that the crystal body of the present invention should be formed within a range so-called "Coupled Eutectic Zone" in which an intrinsic relationship of material system holds among the acceptable range, the temperature gradient, and the solidification rate.

Figure 2A:
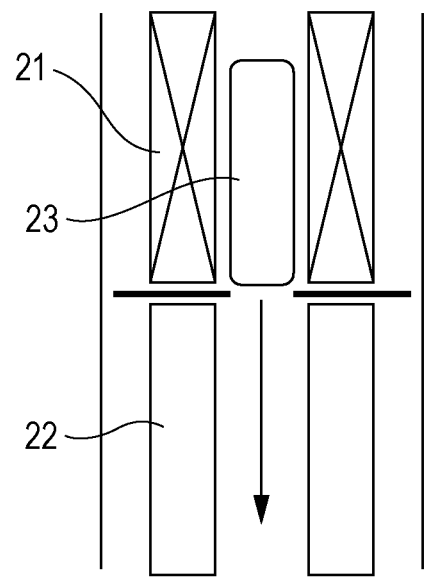
FIGS. 2A and 2B are each a schematic view showing a method for manufacturing a scintillator crystal body of the present invention.
Figure 2B:
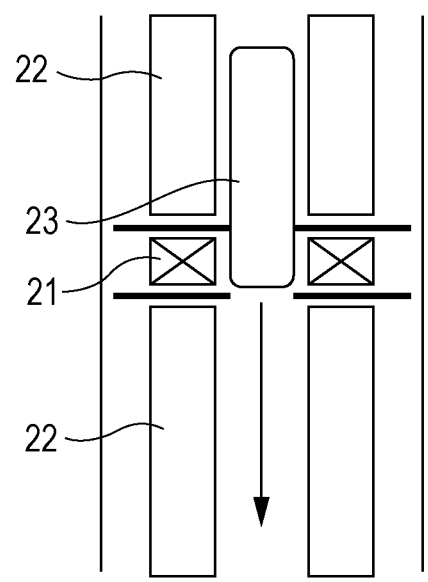

FIGS. 2A and 2B are each a schematic view showing a method for manufacturing a scintillator crystal body of this embodiment.

As shown in FIGS. 2A and 2B, according to a Bridgman method, after a sample sealed, for example, in a cylindrical quartz tube so as not to be oxidized is placed in a vertical direction, since a heater or the sample is moved at a predetermined rate, the solidification interface of the sample can be controlled; hence, the phase separation scintillator crystal body of this embodiment can be manufactured.

In particular, an apparatus shown in FIG. 2A includes a heater portion 21 having a length equivalent to that of a sample 23 and a water-cooling portion 22 which realizes a temperature gradient of 30° C./mm or more at a solid-liquid interface of the sample 23 which is a mixture substance.

In addition, as an apparatus shown in FIG. 2B, an apparatus in which two water-cooling portions 22 are provided top and bottom and a heater portion 21 corresponds only to a part of the sample 23 may also be used. Furthermore, a method performing steps equivalent to those described above may also be used. However, when the solid-liquid interface can be made smooth, the temperature gradient may be less than 30° C./mm.

A method for pulling up a crystal from a melt, such as a Czochralski method, may also be used for the formation. In this case, since solidification is not performed in a sample container of a Bridgman method, the solid-liquid interface can be formed without receiving any influences of the container wall surface, and hence the above method is more preferable. Furthermore, although a floating zone method may also be used for the formation, since the material system of this embodiment has almost no infrared absorption properties, direct heating by infrared radiation cannot be performed as a heating method, and hence an addition material and the like must be devised.

In particular, in a Bridgman method, although the solidification rate of the sample must be set so as to make the solid-liquid interface as flat as possible, heat exchange is primarily performed through the side surface of the sample, and hence the solidification rate depends on the diameter of the sample. That is, when the diameter of the sample is large, the heat exchange takes a long time, and the solid-liquid interface is considerably warped unless the solidification rate is decreased, so that a curved columnar crystal may be formed. The reason for this is that the growth direction of the columnar crystal is approximately vertical to the solid-liquid interface. Furthermore, when the solidification rate is faster with respect to the sample size, the solid-liquid interface cannot be maintained flat and smooth, and micro undulations are generated to cause the generation of dendrites; hence, it is important to avoid the above situation. Hence, a sufficient temperature gradient at the solid-liquid interface of the sample is set, and at the same time, the solidification rate (pull-down rate of the sample by the apparatus) of the sample is preferably set to 850 mm/hour or less. The solidification rate is more preferably set to 500 mm/hour or less and is even more preferably set to 300 mm/hour or less.

In addition, regardless of the method, after the solid-liquid interface is controlled to have a convex surface from the solid side toward the liquid side so that the crystal body is formed into an optically single grain, and after a single grain is once formed, the convex surface is preferably controlled to a flat surface. However, as long as no practical problems may occur, a crystal formed with a convex-shaped solid-liquid interface may also be processed by cutting for the use.

In addition, the diameter and the period of the columnar crystal of the phase separation scintillator crystal body depend on the solidification rate of the sample, and in particular, it is believed that as for the period of the columnar crystals, the following formula holds. When the period is represented by λ and the solidification rate is represented by v, $\lambda^2 \times v = $ constant holds. Hence, if there is a desired structural period, the solidification rate is inevitably and roughly restricted by the above formula. On the other hand, as the restriction of the manufacturing method, there is a solidification rate which can control the solid-liquid interface to be flat and smooth, and hence, the period λ is set in a range of 500 nm to 50 μm. In addition, in accordance with the above range, the diameter of the columnar crystal is also set in a range of 50 nm to 30 μm.

In this embodiment, the cross-sectional shape of the columnar crystal may not be circular in some case, and when the above shape has an irregular form, the shortest diameter thereof is within the range described above. In addition, based on the average value of many columnar crystals, the ratio of the longest diameter to the shortest diameter is preferably 10 or less. When the ratio is more than that described above, the structure should be appropriately regarded as a lamella structure. However, although some columnar crystals among a tremendous number of columnar crystals have a value of more than 10, when the average value is 10 or less, the columnar crystals are within the acceptable range. In addition, in view of the formation conditions, a lamellar structure can be more easily formed when the molar ratio of the material forming the first crystal phase and that forming the second crystal phase is closer to 1:1, and hence, in consideration of this tendency, the formation conditions and the additives are preferably selected.

Next, a starting composition of a raw material forming the sample will be described. Although the composition ratio of the material forming the first crystal phase and that forming the second crystal phase of the phase separation scintillator crystal body described above is the value shown in each table, as for the starting composition, ±4 percent by mole or more may be deviated therefrom. That is, in a Bridgman method, when the entire sample is solidified in a unidirectional direction from the state in which the entire sample is melted, a material deviated from the eutectic composition is first precipitated at an initial solidification stage, and a remaining melt has the eutectic composition. In addition, in a Czochralski method, since a deviated portion is pulled up from the melt at an initial pull-up stage, it may also be preferable that after pulling is once performed as a dummy operation so that the melt has the eutectic composition, pulling is again performed. An unnecessary portion may be cut off after the crystal body is formed.

Next, the radiation detector of each of the above embodiments has the above scintillator crystal body and a photodetector, and the scintillator crystal body is disposed so that the first principal surface or the second principal surface faces the above photodetector. The scintillator crystal body is preferably disposed on the photodetector with or without at least one protective layer interposed therebetween.

When being combined with a photodetector, the phase separation scintillator crystal body of this embodiment can be used as a radiation detector for medical use, industrial use, high-energy physical use, and space use. In particular, since having a light guide function without providing partitions and the like, the phase separation scintillator crystal body of this embodiment is preferably used when light must be guided in a specific direction toward a detector. In addition, the phase separation scintillator crystal body of this embodiment is effectively used in an x-ray CT apparatus in which partition formation is required and can replace a CsI needle crystal film of an x-ray flat panel detector (FPD). In particular, since RbI, CsBr, RbBr, CsCl, or RbCl is contained, when x-ray energy used for an image pick-up by mammography is approximately 20 KeV, the phase separation scintillator crystal body of this embodiment preferably has a linear attenuation coefficient equivalent to that of CsI (cesium iodide). In the above uses, the luminescence wavelength of the scintillator may be adjusted by addition of another material or a luminescence center to base materials so as to fit with light-receiving sensitivity characteristics of a photodetector.

Furthermore, the detector and the phase separation scintillator crystal body of this embodiment are preferably bonded or disposed to each other with or without at least one film or layer functioning as a protective layer, an antireflection layer, or the like.

Example 1

Examples 1 to 8 are examples corresponding to the first embodiment described above. The examples will be sequentially described from Example 1. In Example 1, powders obtained by mixing NaBr, NaCl, NaF, and KCl (each material forming a first crystal phase) in an amount, respectively, of 40, 30, 5, and 40 percent by mole with CsI (material forming a second crystal phase composition) were prepared, and the powders were separately vacuum-sealed in respective quartz tubes, thereby forming samples. Next, after each of those samples was introduced into a Bridgman furnace as shown in FIG. 2A and was heated to 800° C. so as to be entirely melted (fused), the temperature was held for 30 minutes, and the melt temperature was then decreased to a temperature 20° C. higher than the eutectic point shown in Table 1. Subsequently, the sample was pull down at a rate of approximately 10 mm/hour so that the sample was sequentially solidified from a lower portion thereof.

In addition, when the sample entered a region in which cooling water of the furnace was circulated, the difference in temperature at a solid-liquid interface which was the boundary between a portion at which the sample was melted and a portion at which the sample was solidified was set to 30° C./mm or more. As described above, the sample was solidified along one direction, so that a eutectic compound was generated.

Figure 3A:
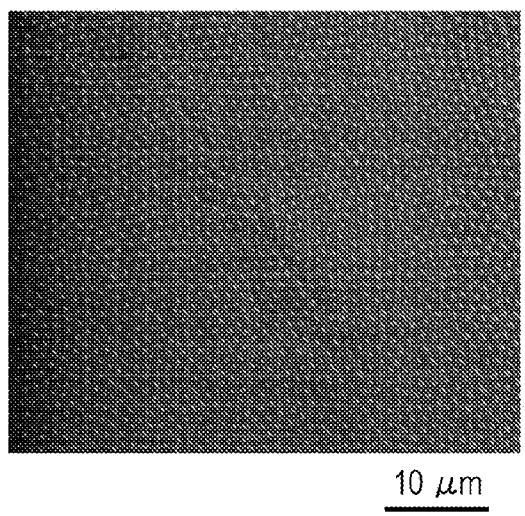
FIGS. 3A to 3F are each a scanning electron microscope image of a scintillator crystal body of the present invention.
Figure 3B:
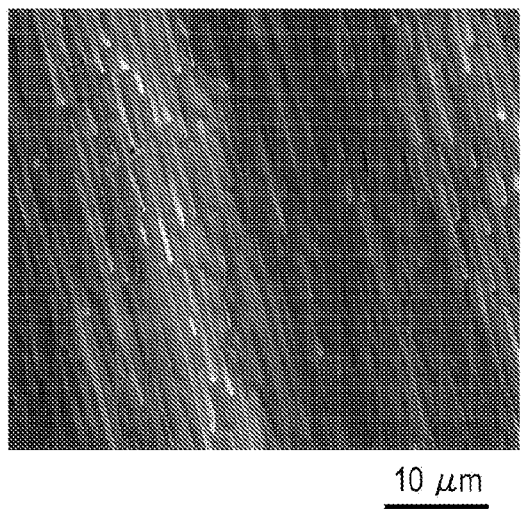

The four types of samples thus formed were processed by cutting, and the structures thereof were observed by a scanning electron microscope (SEM). As a result, as shown in FIGS. 3A and 3B, in the CsI—NaCl system, the structure (structure viewed from a first principal surface and a second principal surface) of a plane perpendicular to the solidification direction was as shown in FIG. 3A, and the structure in a parallel direction was as shown in FIG. 3B. In addition, by a composition analysis provided for the SEM, it was found that the columnar crystal contained NaCl and the periphery thereof contained CsI. As described above, it was found that the structure was formed such that many columnar crystals of NaCl each had a unidirectional characteristic, and CsI surrounded the peripheries of the columnar crystals.

Although the structure viewed from the first principal surface and that viewed from the second principal surface were described using only one drawing, the reason for this is that since the structure viewed from the first principal surface and that viewed from the second principal surface were very similar to each other, one of the structures was representatively shown in the figure, and it was also confirmed that the first crystal phase of columnar crystals and the second crystal phase having a high refractive index were both exposed to the first principal surface and the second principal surface. In addition, as shown in FIG. 3B, it was also confirmed that those exposed portions were connected to each other.

In the other examples which will be described below, although the structure viewed from the first principal surface and the structure viewed from the second principal surface will be described only using some of drawings; however, as described above, it should be understood since the structures of the two principal surfaces are very similar to each other.

Figure 3C:
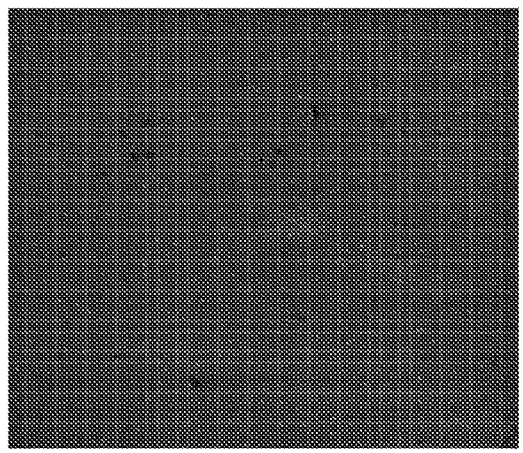
Figure 3D:
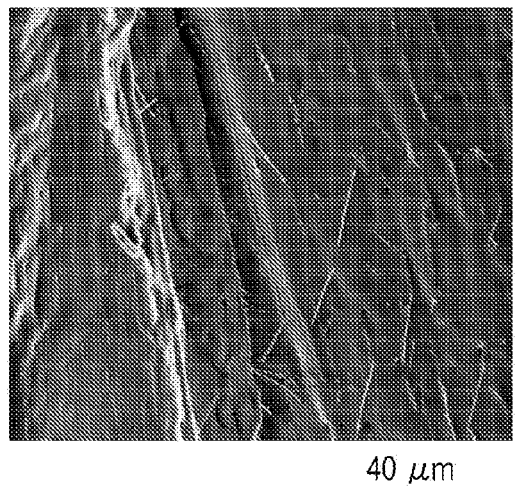

As in the case described above, in the CsI—NaF system, the structure (structure viewed from the first principal surface, the second principal surface) of a plane perpendicular to the solidification direction was as shown in FIG. 3C and the structure in a parallel direction was as shown in FIG. 3D. In addition, it was found that the columnar crystal contained NaF and the periphery thereof contained CsI.

Figure 3E:
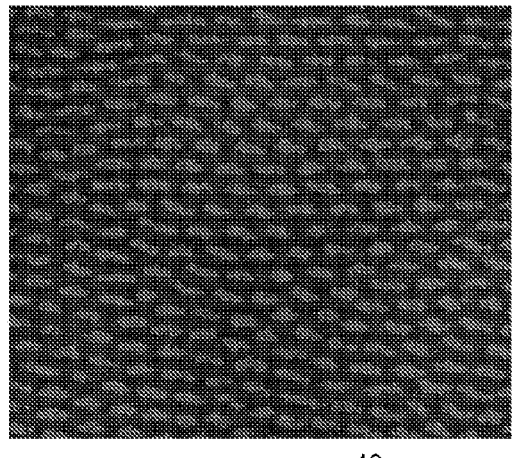
Figure 3F:
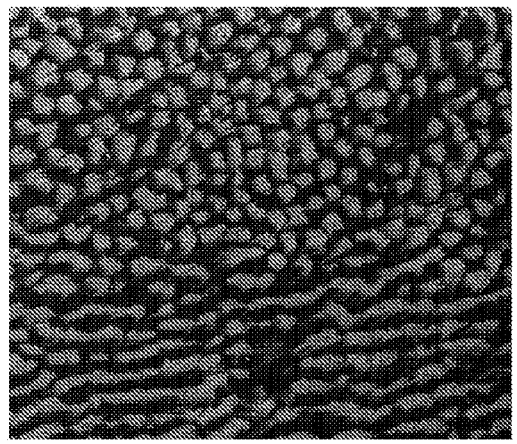

As for the outstanding CsI—NaBr system and CsI-KCl system, it was found that when planes perpendicular to the solidification direction (structures viewed from the first principal surface, the second principal surface) were as shown in FIGS. 3E and 3F, respectively, and the columnar crystals contained NaBr and KCl, respectively. In this example, in the KCl system, in a part of the region of the image, columnar crystals were observed as if being connected to each other, for example, by fluctuation of formation conditions; however, the essence of the present invention was not influenced thereby.

Accordingly, the phase separation scintillator structure of the present invention in which the second crystal phase included CsI was confirmed.

Example 2

The effect obtained by adding a luminescence center will be described using the CsI—NaCl system formed in Example 1. First, according to the sample formed in Example 1 to which the luminescence center was not added, it was found that a luminescent color by x ray excitation (tungsten bulb; 60 kV; 1 mA) was pale, and light was emitted by radiation excitation without any addition. However, according to the properties of the material system in this case, since the state was formed in which a small amount of Na (CsI:Na was also known to emit light although the luminescent mechanism was not understood) was spontaneously added to CsI, luminescence caused thereby was also included; however, the luminescence center was not intentionally added.

Next, by a manufacturing method similar to that of Example 1, samples were formed by adding 0.01 percent by mole of InI (indium iodide (I)), 0.01 percent by mole of TlI (thallium iodide (I)), and 0.01 percent by mole of Ga (added in a metal state) to the CsI—NaCl system. As in the case described above, when each luminescence was confirmed by x-ray excitation, as for the color touch of the luminescence by visual inspection, green was obtained by InI addition, and white was obtained by TlI addition and Ga addition. All of samples had very high luminance. As described above, the luminescence was also confirmed by addition of the luminescence center of In, Tl, or Ga. In this case, the addition composition of the luminescence center is not limited to 0.01 percent by mole.

Hence, in the sample added with InI, in order to investigate where and how this phase separation scintillator crystal body emits light, a cathode luminescence (CL) which could measure local luminescence by electron beam excitation was used. Focused electron beams of 5 keV were used, and a luminescence spectrum of the columnar crystal containing NaCl and that of the region containing CsI located therearound were separately measured. At this time, the measurement was very carefully performed so as to prevent electron beams of an excitation source from widely spreading in the crystal body and exciting the other portion. In addition, although the difference in spectrum between x-ray excitation and electron beam excitation may arise to a certain extent, since the energy of electron beams is high such as 5 keV, it is believed that base material excitation similar to the x-ray excitation mainly occurs rather than direct excitation of the luminescence center, and hence the luminescence properties were evaluated by this method.

Figure 4A:
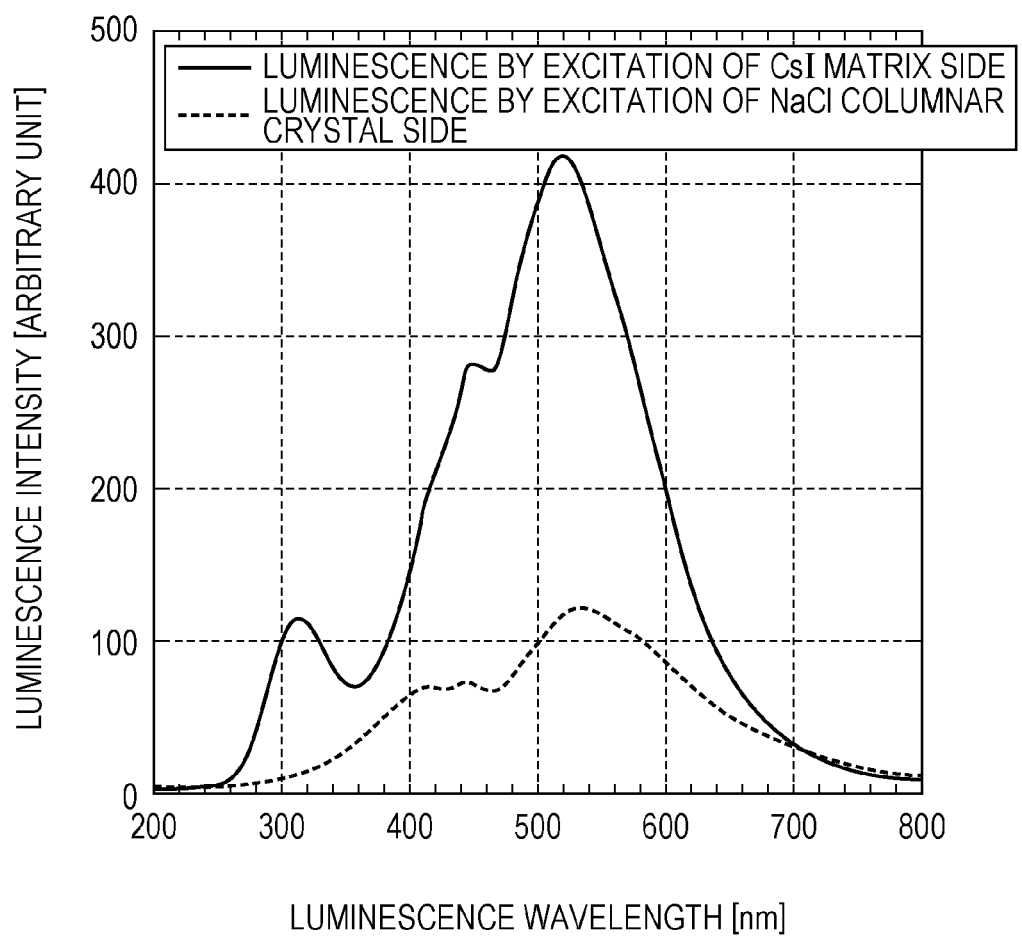
FIG. 4A is a graph showing electron beam induced luminescence spectra of a CsI—NaCl-system phase separation scintillator crystal body added with InI.
Figure 4B:
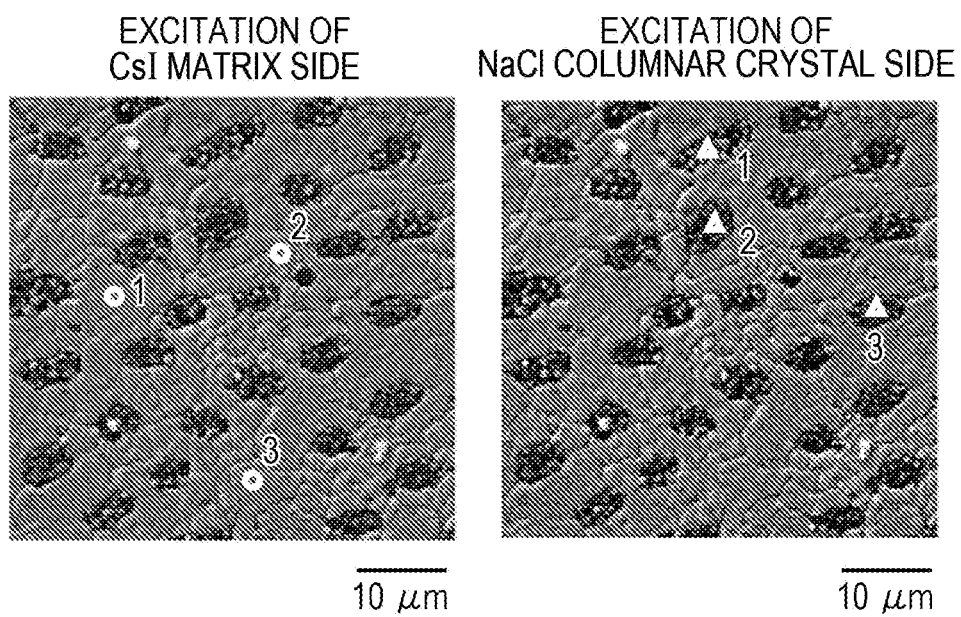
FIG. 4B includes scanning electron microscope images of a CsI—NaCl-system phase separation scintillator crystal body.

The results are shown in FIG. 4. Two spectra of FIG. 4A are each the average of spectra obtained by electron beam excitation of six points in each of two scanning electron microscope images shown in FIG. 4B. In addition, three points out of the six excited points are illustrated in each image shown in FIG. 4B. First, a solid line spectrum indicates the luminescence in the region containing CsI, and green luminescence was observed. In addition, as in the case described above, a dotted line spectrum was obtained when the columnar crystal containing NaCl was excited, and it was confirmed that a luminescence peak position was almost the same as that of the solid line spectrum and that the luminescence was green. As described above, it was shown that the phase separation scintillator crystal body of the present invention emitted light regardless of whether the luminescence center was added or not and at the same, as one example, the first and the second crystal phases both emitted light in the case of the In center.

Figure 4C:
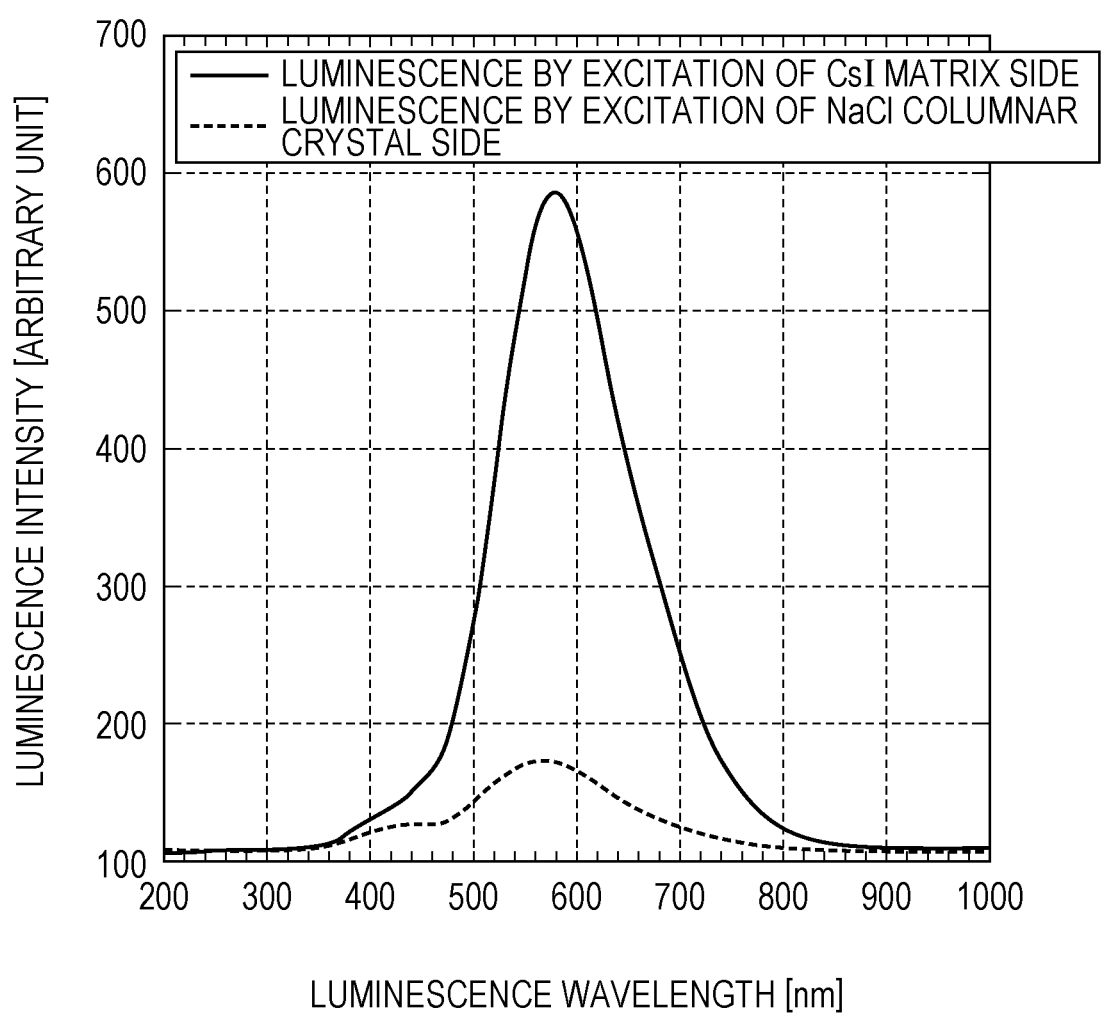
FIG. 4C is a graph showing electron beam induced luminescence spectra of a CsI—NaCl-system phase separation scintillator crystal body added with TlI.

As in the case described above, measurement was performed on the sample in which TlI was added to CsI—NaCl, and the spectra are shown in FIG. 4C. As in the case of the InI addition, it was confirmed that crystal phases both emitted light when being excited.

When the above NaCl phase was excited, in both InI addition and TlI addition, the intensity of the characteristic luminescence of In-added NaCl at approximately 410 nm was small as compared to that of the luminescence at 530 nm, and the characteristic luminescence of Tl-added NaCl at approximately 350 nm itself was not observed. However, since certain light could be extracted outside by the NaCl phase excitation, in the present invention, it was expressed that the two phases both emitted light.

Example 3

This example relates to the luminous quantity with respect to a Tl concentration in the system in which TlI was added to CsI—NaCl which was a phase separation scintillator crystal body.

Light emitted by irradiation of x rays obtained at 60 kV and 1 mA without an Al filter using a tungsten bulb was integrated by an integrating sphere, and based on the value thus obtained, the luminous quantity was relatively compared.

Figure 5:
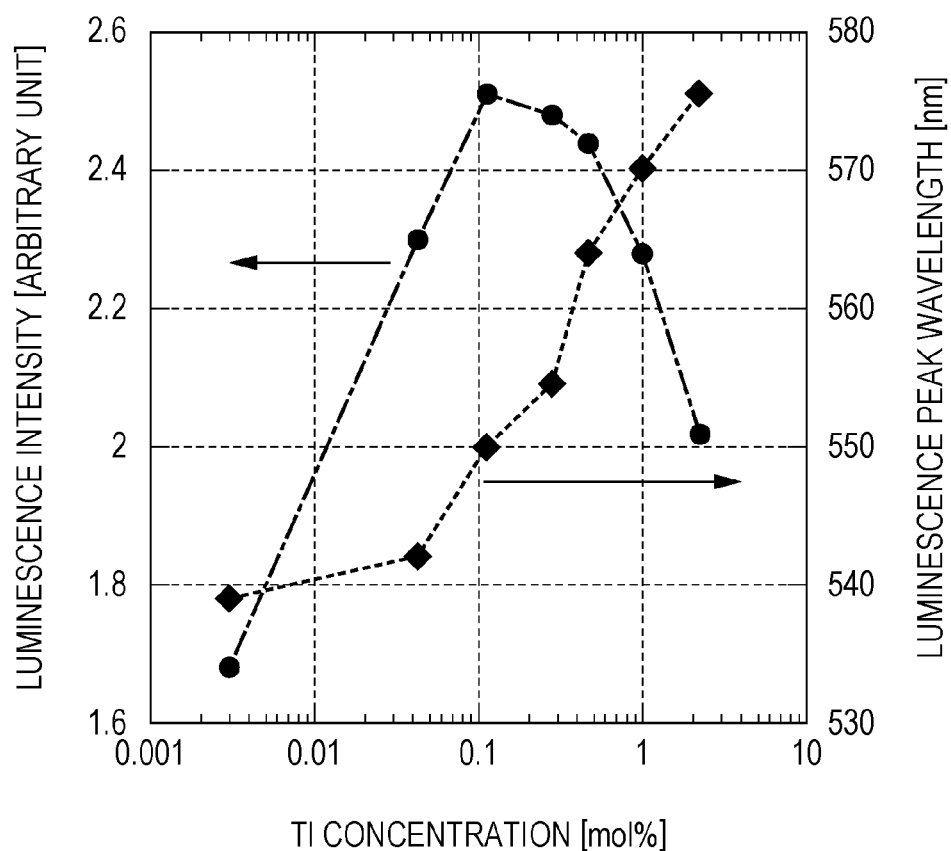
FIG. 5 is a graph showing Tl concentration dependence of luminous quantity and luminescence peak wavelength in a CsI—NaCl system.

In FIG. 5, the luminescence wavelength and the relative luminance with respect to the TlI concentration added to CsI—NaCl are shown. As a result, it was found that the optimum value of the Tl concentration with respect to the luminous quantity was in a range of 0.04 to 1.0 percent by mole. However, since the luminescence wavelength shifts to a long wavelength side in proportion to the concentration, the optimal concentration may not be limited only to the above range in consideration of a sensitivity curve of a light receiving element, and the optimal range may be determined in consideration of the above two factors.

Example 4

Figure 6:
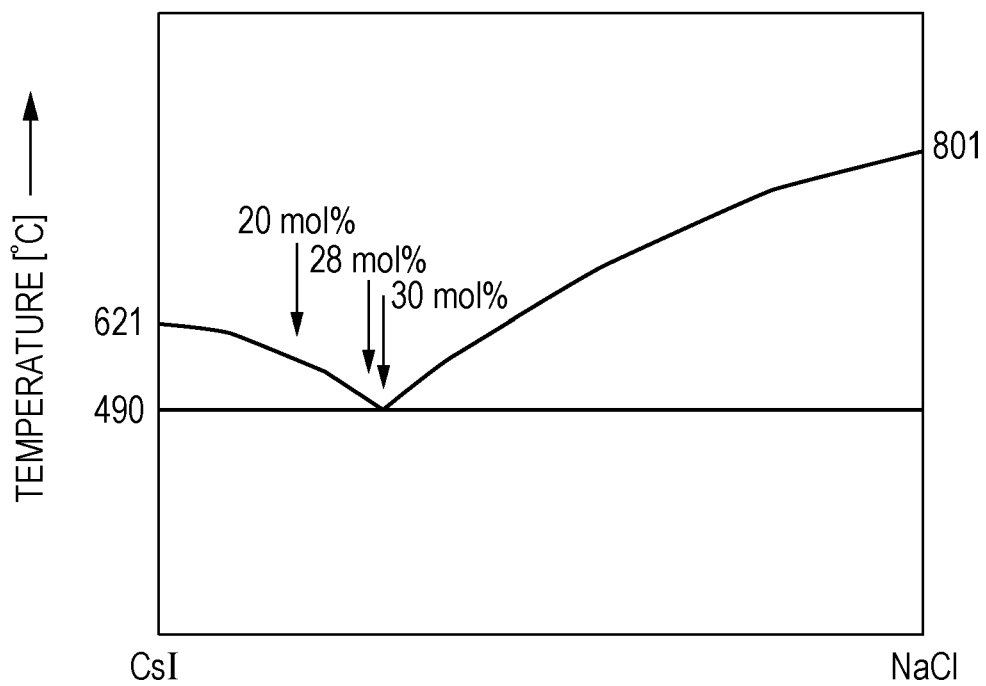
FIG. 6 is an equilibrium diagram of a CsI—NaCl system.

As the composition of the phase separation scintillator crystal body of the present invention, three samples shown by arrows in a phase diagram shown in FIG. 6, that is, CsI—NaCl (20 percent by mole), CsI—NaCl (28 percent by mole), and CsI—NaCl (30 percent by mole), were formed by an apparatus similar to that of Example 1 shown in FIG. 2A and were formed by an apparatus as shown in FIG. 2B in which a heater portion was narrow, and a sample was locally melted, thereby forming totally 6 types of samples.

Figure 7A:
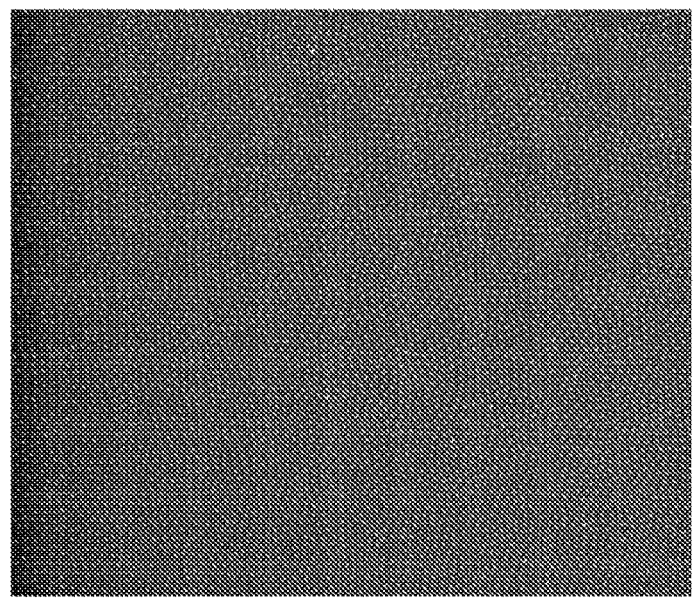
FIGS. 7A and 7B are scanning electron microscope images showing the difference of a phase separation structure by the composition of a scintillator crystal body.
Figure 7B:
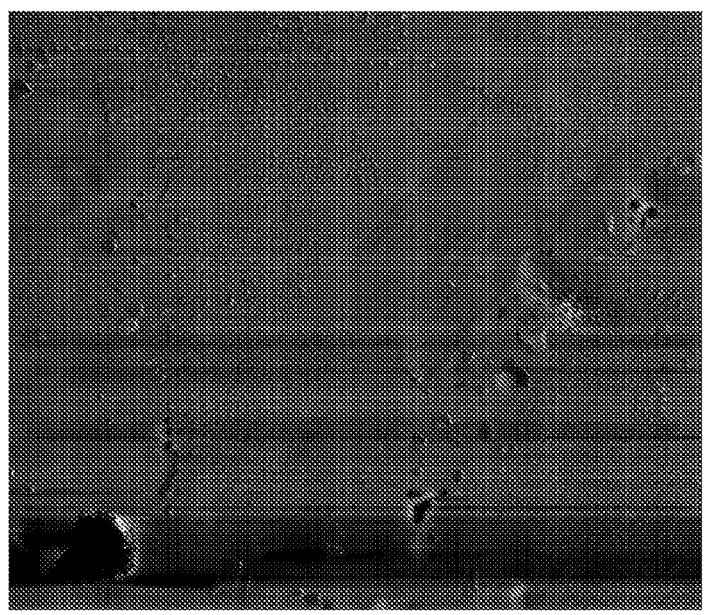

In the case similar to that Example 1 in which solidification was started after the entire sample was melted at an early stage, it was found that by all the samples formed as described above, as the structure of the first principal surface and that of the second principal surface, an excellent structure as shown in a scanning electron microscope (SEM) image of FIG. 7A was obtained. However, in the case of NaCl (20 percent by mole), a crystal was formed together with precipitation of CsI dendrites in a solidification initial area of the sample as shown in FIG. 7B, and thereafter, an excellent region as shown in FIG. 7A was formed. In the cases of the other NaCl (28 percent by mole) and NaCl (30 percent by mole), a solidification initial area of the sample similar to that at a concentration of 20 percent by mole was not clearly formed, and a significant difference was not seen between the above two samples. However, since the difference caused by the difference in concentration of 2 percent by mole may also be partially influenced, for example, by impurities of raw materials, the present inventors do not conclude that no difference was present.

As described above, when the entire sample was melted, since a material deviated from a eutectic composition was precipitated at a high temperature in the solidification initial area of the sample, the remaining melt portion had the eutectic composition, and hence it was believed that after the above precipitation, an excellent structure could be formed.

In addition, in the case in which solidification was performed by melting a local area of the sample as shown in FIG. 2B, in the system of NaCl (20 percent by mole), CsI dendrites were present at any place of the sample as shown in FIG. 7B, and although some columnar crystals of NaCl were formed therebetween, this structure was not a targeted structure. However, in the case of NaCl (28 percent by mole) and NaCl (30 percent by mole), as shown in FIG. 7A, the columnar crystals of NaCl were formed over the entire area, and an excellent sample could be obtained.

However, it was observed that although being partially influenced by impurities and the like, the structure of the sample of NaCl (28 percent by mole) was more distorted than that of the sample of NaCl (30 percent by mole). Hence, when the solidification was performed by local melting, it was found that since this solidification was not subjected to a process in which the composition was optimized in the sample when the entire was melted, the composition and the structure sensitively influenced each other.

Hence, in the phase separation scintillator crystal body of the present invention, although a slight fluctuation of the composition of approximately 2 percent by mole had not considerable adverse influence on the structure formation, a considerable fluctuation of 10 percent by mole had adverse influences; hence, it was clear that the optimal composition was in the vicinity of the eutectic composition. In addition, it was found that when solidification was controlled after the entire sample was melted in the manufacturing, even if the composition was deviated, a deviated material was preferentially precipitated in the solidification initial area of the sample, and an excellent region could be obtained from the remaining melt of the eutectic composition, and this finding is important.

Example 5

The controllability of the structure size will be described using a CsI—NaCl system as an example. Four powders in which 30 percent by mole of NaCl was mixed with CsI were prepared in quartz seal tubes, and the samples were formed by a manufacturing method similar to that of Example 1. The pull-down rates of the samples were 10.4, 31.3, 94.0, and 232 mm/hour.

The formed sample was cut along a plane perpendicular to the solidification direction, and the surfaces of the sample (the first principal surface, the second principal surface) were observed by a SEM, and the diameter and the period of the NaCl columnar crystal of the phase separation structure were obtained.

Figure 8:
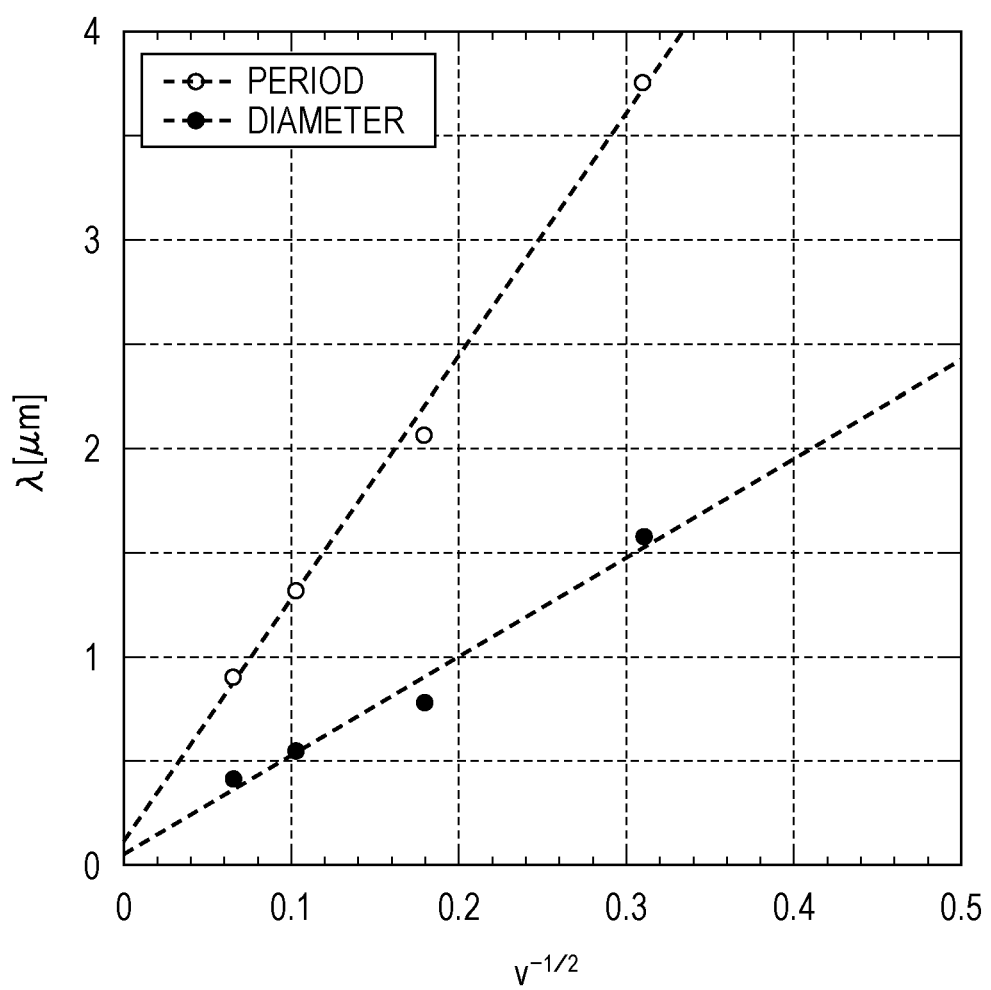
FIG. 8 is a graph showing solidification rate dependence of the structural period and diameter of a CsI—NaCl-system phase separation structure.

As a result, as shown in the graph of FIG. 8, the dependence was obtained in which as the pull-down rate, that is, the solidification rate, was decreased, the period and the diameter were increased. As for the period, the formula of $\lambda(period)= 0.0897+11.7 \ (v^{-1/2})$ was approximately satisfied. In this embodiment, v indicates the pull-down rate (solidification rate).

Hence, by the conversion, a structural period of 50 μm is obtained at a pull-down rate of 0.055 mm/hour (1.319 mm/day)) close to 1 mm/day which is a rough indication of a very low rate. By the conversion, a structural period of 500 nm is obtained at a pull-down rate of 813 mm/hour close to 850 mm/hour which is a rough indication of an upper limit of a fast rate. In addition, as for the diameter, the formula of $\lambda(diameter)=0.0412+4.78 \ (v^{-1/2})$ was obtained. Hence, as in the case of the period, by the conversion, a diameter of approximately 20.4 μm is obtained at a rate of 0.055 mm/hour, and a diameter of approximately 209 nm is obtained at a rate of 813 mm/hour.

Hence, it was found that structure size could be widely controlled by the control of the solidification rate. However, this example is just one example, and although the correlation of $\lambda^2 \times v=constant$ (v is the solidification rate) also holds for other material systems, the constant is different.

Example 6

Figure 9A:
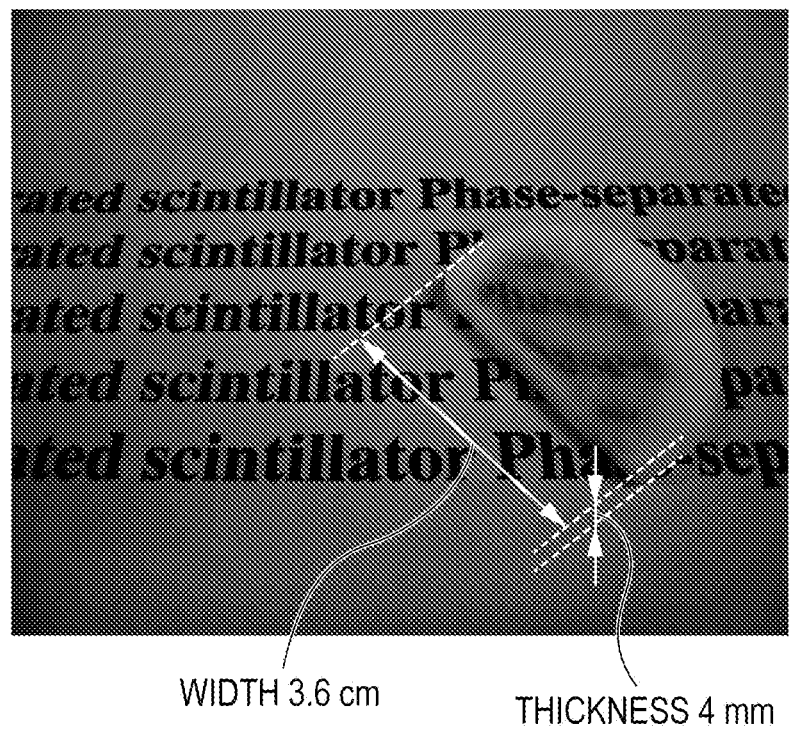
FIG. 9A is a photograph showing a light guide property of a scintillator crystal body of Example 5 of the present invention.
Figure 9B:
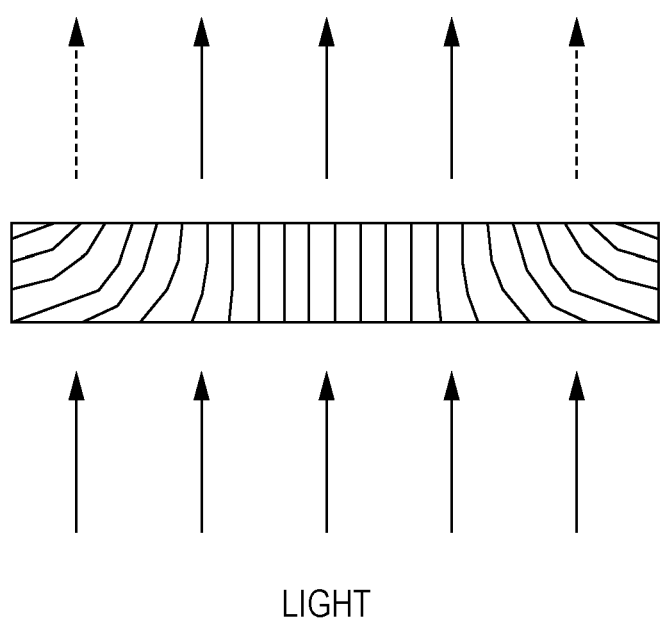
FIG. 9B is a schematic view showing the light guide property of the scintillator crystal body of Example 5 of the present invention.

This embodiment relates to the light guide of a phase separation scintillator crystal body, and FIG. 9A shows the case in which a phase separation scintillator crystal body of In-doped CsI—NaCl (30 percent by mole) formed by a Bridgman method was disposed on the plane. The thickness of the crystal was approximately 4 mm. At a crystal central portion, characters printed on the plane were observed as if floating through the crystal body, and this indicated that no light scattering factors were present in a direction perpendicular to the plane on which the characters were printed. In addition, in the periphery of the crystal body, the characters printed on the plane could not be observed, and white color was only observed; hence, this indicated that light was scattered in a direction perpendicular to the plane. This situation can be described as follows. That is, as schematically shown in FIG. 9B, at the central portion of the crystal, the NaCl columnar crystals which were the first crystal phase were aligned in a direction perpendicular to the plane on which the characters were printed, and at the peripheral portion, by the reason of the manufacturing method in which the solidification interface was warped at the outside, the NaCl columnar crystals were curved from the side surface to the upper surface. First, in the portion in which the columnar crystals aligned in the direction perpendicular to the plane on which the characters were printed, since no scattering factors (change in refractive index, structural non-uniformity, and the like in the direction perpendicular to the plane on which the characters were printed) were present, the characters on the plane were observed as if floating, and hence this indicated that light was guided through a thickness of 4 mm.

Furthermore, since the columnar crystals were curved at the peripheral portion, no columnar crystals extending from the plane to the upper surface were present, light was scattered thereby, and only white color was observed; hence, it was apparent that light was not guided toward the upper surface. That is, this indicated that the light guide was performed in the direction along the columnar crystal, and that the light guide was not performed in the direction perpendicular to that in which the columnar crystal extended. In addition, it was confirmed that when an object was placed at the side surface of the crystal, the light was curved and guided to the upper surface thereof, and hence, even if the columnar crystal was curved, light was guided therealong.

Figure 9C:
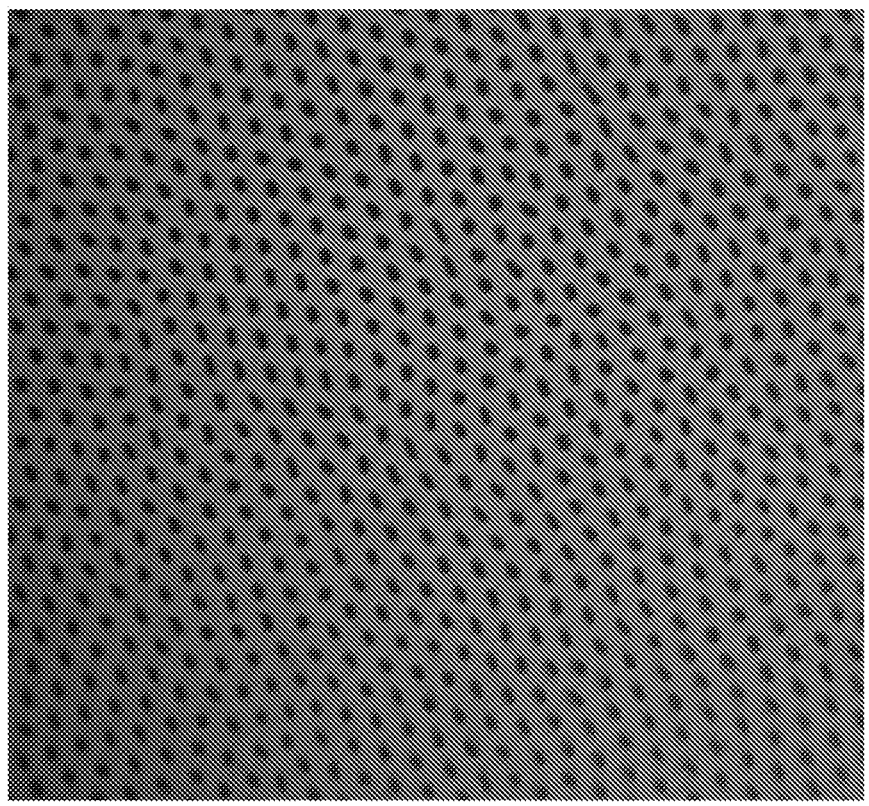
FIG. 9C is a transmission optical microscope image showing the light guide property of the scintillator crystal body of Example 5 of the present invention.

Subsequently, when the portion in which the characters were observed through the crystal as shown in FIG. 9A was enlarged by an optical microscope, and a transmission image was observed, an image shown in FIG. 9C was obtained (that is, image of the first principal surface, the second principal surface). In the transmission image, the NaCl columnar crystals were clearly observed as black dots, and CsI which was the matrix side was observed brighter than that. That is, the situation in which a large transmission quantity of incident light was guided by the CsI matrix side was also exactly observed.

Hence, it was confirmed that the phase separation scintillator crystal body of the present invention had properties of reliably guiding light only in the columnar crystal direction.

Example 7

This example relates to the case in which the second crystal phase contains CsI as a primary component, and one of RbI, CsBr, and RbBr is added thereto.

In this example, by using a CsI—NaCl system, samples in which the compositions of RbI with respect to CsI were 15, 30, and 50 percent by mole, samples in which the compositions of CsBr were 20 and 50 percent by mole, and samples in which the compositions of RbBr were 10, 15, and 50 percent by mole were formed by a manufacturing method similar to that of Example 1.

Those samples were cut into pieces having a thickness of approximately 200 μm along a plane perpendicular to the NaCl columnar crystal of the sample, and an optical microscope image was obtained by a transmission arrangement for the first principal surface or the second principal surface. The results are as shown in the following Table 14. In the table, the samples are categorized by the light guide property obtained when x percent by mole of a material A is added to CsI. X [percent by mole] in the table indicates the ratio of the material A in the second crystal phase, and the total of CsI and the material A is set to 100%. In addition, the light guide characteristics are shown by the following 4 classes, that is, ◉: excellent light guide, ○: slight degradation in light guide; Δ: light guide property is inferior but light guide is performed along the structure; x: no light guide by the structure.

TABLE 14

| A | X [mol %] | LIGHT GUIDE PROPERTY |
|---|---|---|
| RbI | 15 | ◉ |
|  | 30 | Δ |
|  | 50 | X |
| CsBr | 20 | ◉ |
|  | 50 | ○ |
| RbBr | 10 | ○ |
|  | 15 | Δ |
|  | 50 | X |

From the above results, it was found that the addition range of RbI to the primary component CsI was reasonably set in a range of more than 0 to 20 percent by mole. Furthermore, it was found that the range of CsBr was reasonably set in a range of more than 0 to less than 50 percent by mole, and the range of RbBr was reasonably set in a range of more than 0 to 10 percent by mole.

Figure 10A:
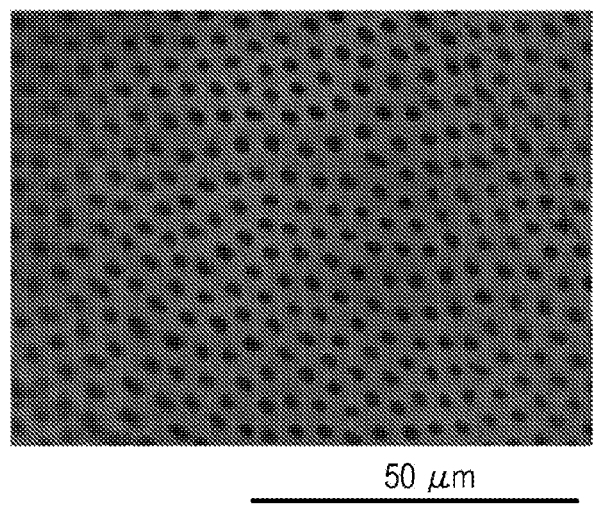
FIGS. 10A to 10C are each a transmission microscope image showing the light guide property of a scintillator crystal body in which one of RbI, CsBr, and RbBr is added to CsI of a second crystal phase.
Figure 10B:
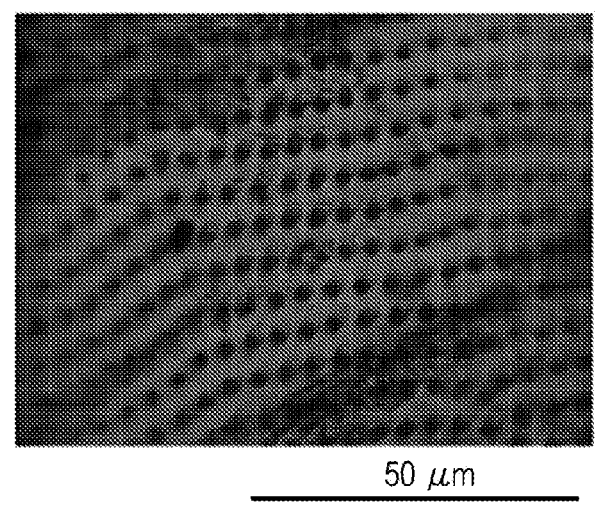
Figure 10C:
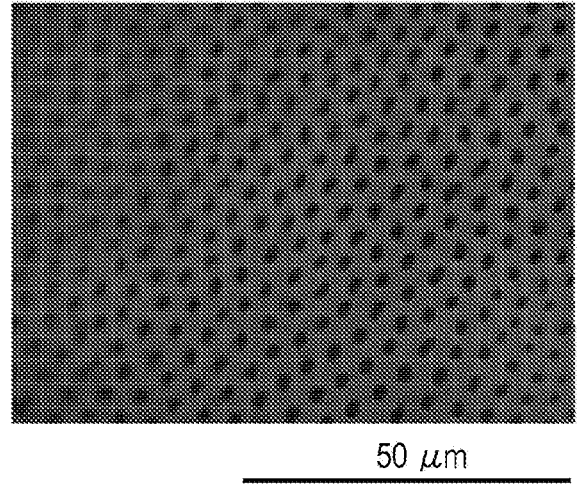

In FIGS. 10A to 10C, transmission microscope photographs of the first or the second principal surface of the sample having an excellent light guide property are shown. FIG. 10A shows a sample in which 15 percent by mole of RbI was added, FIG. 10B shows a sample in which 20 percent by mole of CsBr was added, and FIG. 10C shows a sample in which 10 percent by mole of RbBr was added. In addition, although scratches and/or defects shown in the figures were generated when the sample was processed by cutting, the essence of the present invention was not influenced thereby. As described above, it was confirmed that even if CsI was used as a primary component of the second crystal phase, and one of RbI, CsBr, and RbBr was added thereto, the phase separation scintillator crystal body of the present invention could be formed.

Example 8

This example relates to radiation detection using the phase separation scintillator described in one of the above examples.

Figure 21:
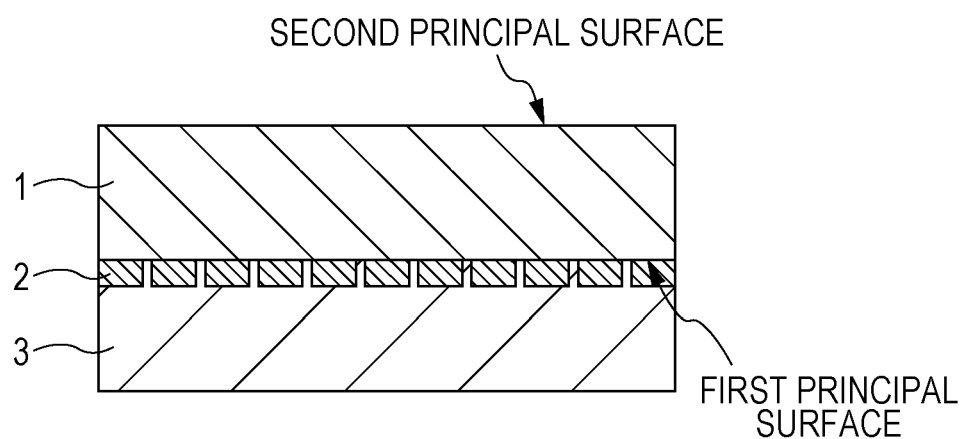
FIG. 21 is a schematic view showing a radiation detector.

A phase separation scintillator crystal body cut into a thickness of 1 mm was arranged on a photodetector array so that the first principal surface or the second principal surface faced photodetectors, and as a result, a radiation detector shown in FIG. 21 was formed. Reference numeral 1 in the figure indicates the phase separation scintillator crystal body described in one of the above examples, reference numeral 2 indicates the photodetector, and reference numeral 3 indicates a substrate. When a single crystal having no partitions was irradiated with x rays, light diffused and propagated in the crystal; however, when the phase separation scintillator crystal body of this radiation detector was irradiated with x rays, it was confirmed by an output of the detector array that light was suppressed from spreading.

Furthermore, it was confirmed that when the phase separation scintillator crystal body and the photodetector array were bonded to each other so as not to form a space therebetween by using a resin, the output of the detector array was increased, and this indicated that a layer structure in consideration of extraction of light from the crystal body to the detector portion was formed.

Figure 11:
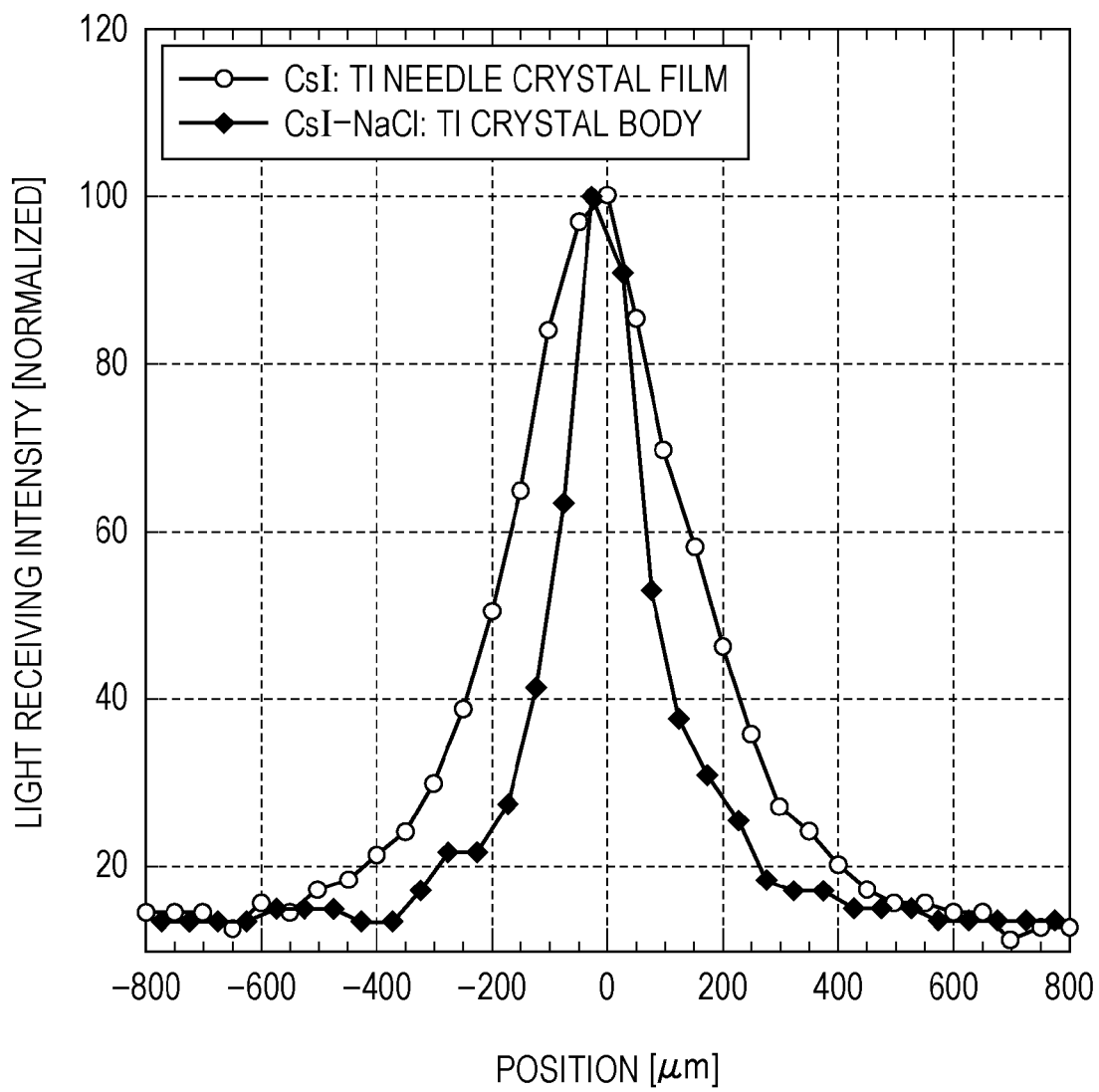
FIG. 11 is a graph comparing the light guide property between a CsI needle crystal and a CsI—NaCl crystal body.

In addition, a Tl-added CsI needle crystal film having a thickness of 430 μm was prepared by a common deposition method as a comparative example, and the spread of light was compared with a Tl-added CsI—NaCl system having a thickness of 1.42 mm as the phase separation scintillator crystal body of the present invention. The sample was irradiated with x rays obtained at 60 kV and 1 mA without an Al filter using a tungsten bulb through an opening having a diameter of 100 μm provided in a tungsten sheet having a thickness of 2 mm, and the light intensity distribution at the bottom surface of the sample was measured. Measurement was performed using CCDs at a 50-micrometer pitch. The intensity profile of the cross-section which passes through the peak value of the distribution is shown in FIG. 11. In FIG. 11, each profile is normalized by the peak value and the relative position is determined with respect to the peak position. Although the full width at half maximum (FWHM) of the CsI needle crystal film was approximately 340 μm, the FWHM of the CsI—NaCl crystal body of the present invention was approximately 160 μm, and it was found that the spread of light was suppressed to not more than one half. Accordingly, although the crystal body of the present invention had a thickness of no less than 1.42 mm, it was confirmed that the spread of light was suppressed as compared to the CsI needle crystal film having a thickness of 430 μm which had been thought to have a light guide effect, and that the crystal body of the present invention had advantages as a scintillator having a light guide function.

Example 9

Examples 9 to 11 are examples corresponding to the above second embodiment. In this Example 9, NaI was used as a primary component of the second crystal phase. In particular, first, powders formed by mixing each of CsI, RbI, NaCl, and NaF with NaI to have a concentration of 51, 50, 40, and 18 percent by mole were prepared, and the powders were separately vacuum-sealed in respective quartz tubes, thereby forming samples. Next, after the sample was placed in a Bridgman furnace as shown by the perspective view of FIG. 2A and was increased in temperature to 800° C. so as to be entirely melted, the temperature was held for 30 minutes, and the melt temperature was then decreased to a temperature 20° C. higher than the eutectic point shown in Table 4. Subsequently, the sample was pulled down at a rate of approximately 10 mm/hour so that the sample was sequentially solidified from a lower portion thereof. In addition, when the sample entered a region in which cooling water of the furnace was circulated, the difference in temperature at a solid-liquid interface which was the boundary between a portion at which the sample was melted and a portion at which the sample was solidified was set to 30° C./mm or more. The four types of samples thus formed were processed by cutting, and the transmission image of the first principal surface or the second principal surface was obtained by an optical microscope. The results are shown in FIGS. 12A to 12E.

Figure 12A:
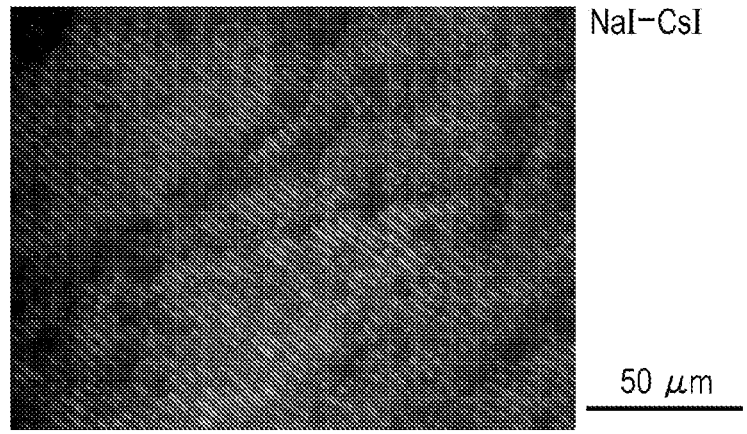
FIGS. 12A to 12E are each a transmission optical microscope image of a phase separation scintillator crystal body.
Figure 12B:
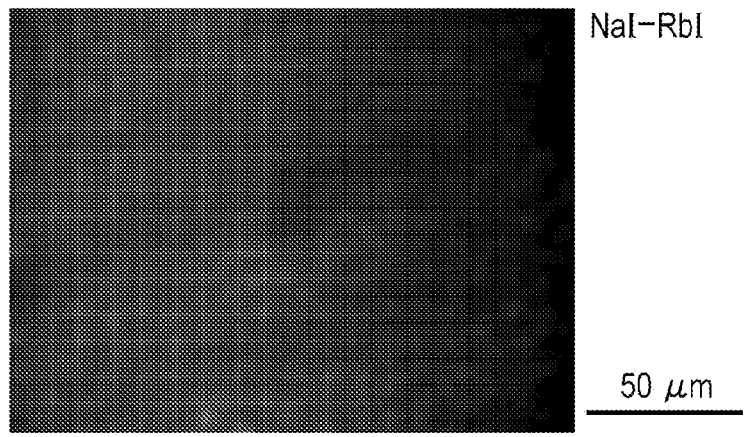
Figure 12C:
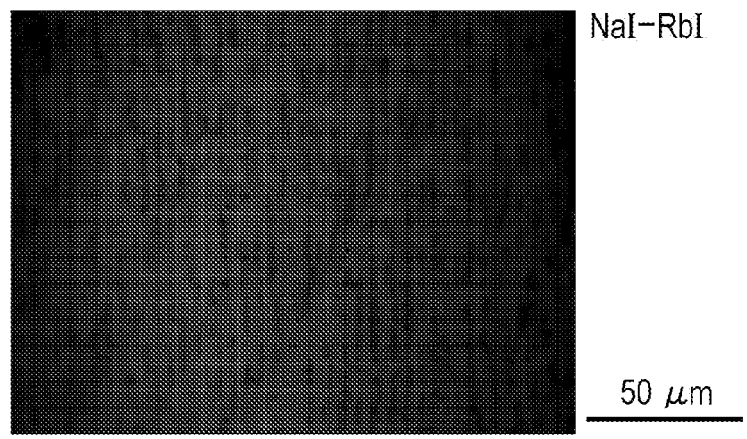

FIG. 12A shows a plane (the first principal surface, the second principal surface) perpendicular to the solidification direction of a NaI—CsI system. From FIG. 12A, the structure in which plate crystals were alternately disposed in close contact with each other, that is, the second configuration, was confirmed. FIG. 12B shows a plane (the first principal surface, the second principal surface) perpendicular to the solidification direction of a NaI—RbI system. From FIG. 12B, the structure in which many NaI columnar crystals were surrounded by RbI, that is, the third configuration, was confirmed. FIG. 12C shows a plane parallel to the solidification direction of a NaI—RbI system. From FIG. 12C, it was confirmed that long NaI columnar crystals were grown along the solidification direction. That is, this indicated that a unidirectional phase separation structure was formed.

Figure 12D:
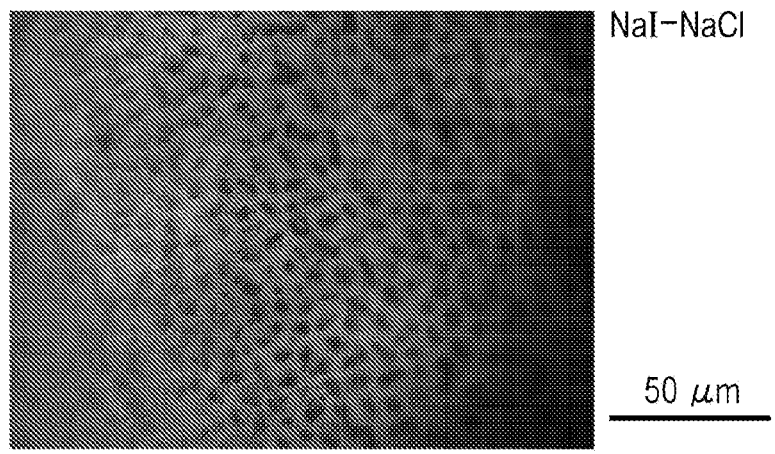

FIG. 12D shows a plane (the first principal surface, the second principal surface) perpendicular to the solidification direction of a NaI—NaCl system.

Figure 12E:
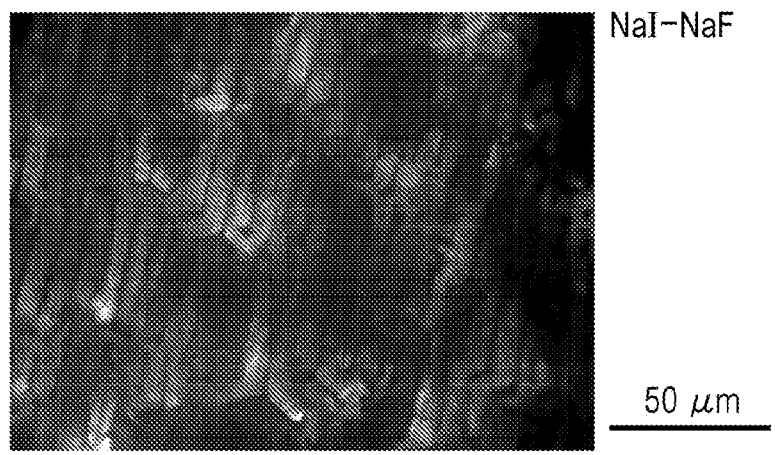
Figure 13A:
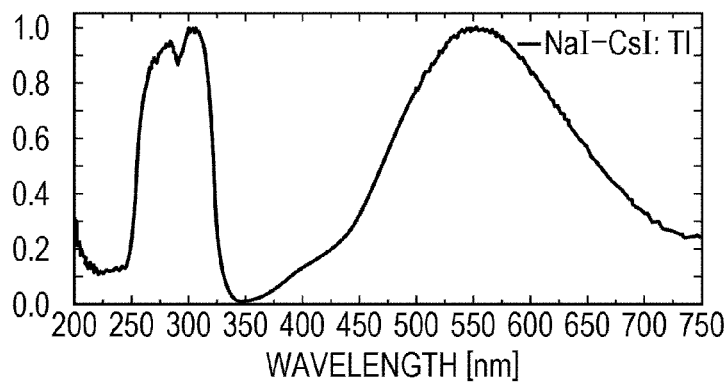
FIGS. 13A to 13D are graphs each showing an excitation spectrum and a luminescence spectrum of a NaI:Tl-containing phase separation scintillator of the present invention.
Figure 13B:
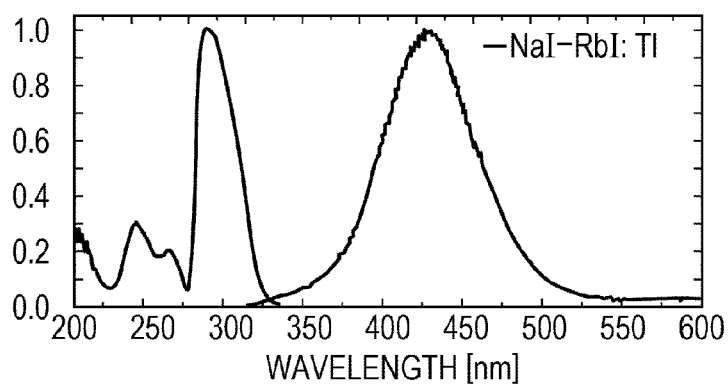
Figure 13C:
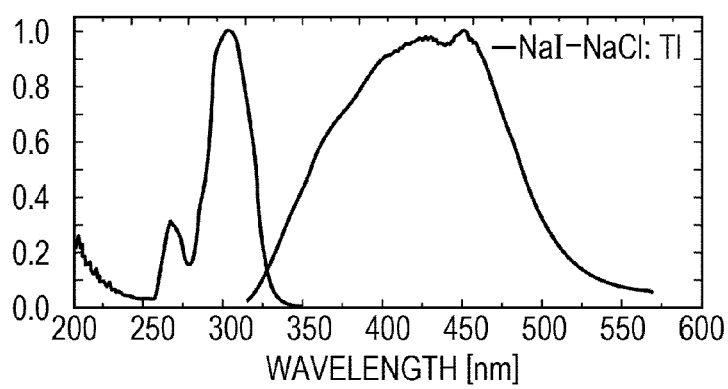
Figure 13D:
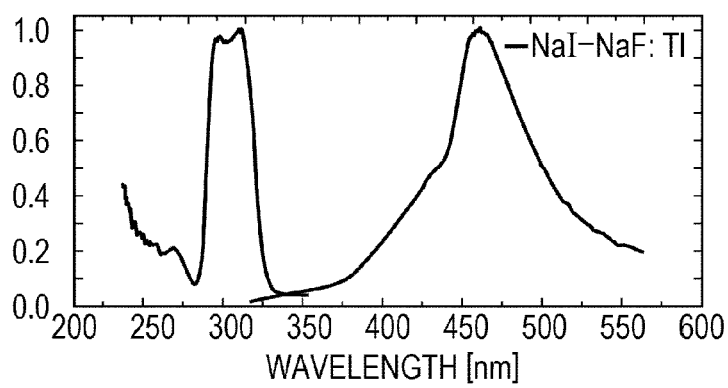

FIG. 12E shows a plane (the first principal surface, the second principal surface) perpendicular to the solidification direction of a NaI—NaF system. From FIG. 12E, it was found that the NaF plate crystal had a three-branch structure.

In this example, since scratches and/or distortions of the image in some regions were caused by marks formed by polishing in the sample formation, and blurs were caused by deliquescence of materials and deviation of focus due to an inclined sample, the essence of the present invention was not influenced thereby.

The optical microscope images shown in FIGS. 12A to 12E were obtained by a transmission arrangement, and the NaI plate crystal side of the NaI—CsI system, the NaI columnar crystal side of the NaI—RbI system, the NaI matrix side of the NaI—NaCl system, and the NaI matrix side of the NaI—NaF system were more brightly observed. These results also indicated that the systems described above had a light guide function.

As described above, it was confirmed that the structure of the present invention in which one of the two phases was formed from NaI functioned as a phase separation scintillator and also had a light guide property.

Example 10

This example relates to the addition of a luminescence center.

By a manufacturing method similar to that of Example 9, samples of four material systems, that is, a NaI—CsI, a NaI—RbI, a NaCl—NaI, and a NaI—NaF system, each added with 0.01 percent by mole of TlI (thallium iodide), were formed. When the luminescence thereof was confirmed by x-ray excitation, the luminescent color of NaI—CsI was pale, and the luminescent colors of the others were all blue. All of samples had very high luminance. The excitation spectrum and the emission spectrum by ultraviolet excitation of each sample are shown in FIGS. 13A to 13D. The horizontal axis indicates the wavelength, the spectrum at a short wavelength side is an excitation spectrum, and the spectrum at a long wavelength side is an emission spectrum. The excitation spectrum was measured at the peak position of the emission spectrum. The NaI—CsI system, the NaI—RbI system, the NaCl—NaI system, and the NaI—NaF system correspond to FIGS. 13A, 13B, 13C, and 13D, respectively. From these spectra, it was confirmed that the samples were all based on blue high luminescence of NaI:Tl known as a material system having high luminance. As described above, the phase separation scintillator crystal body of the present invention emits light by radiation excitation.

Example 11

This example relates to the composition of a phase separation scintillator.

Figure 14:
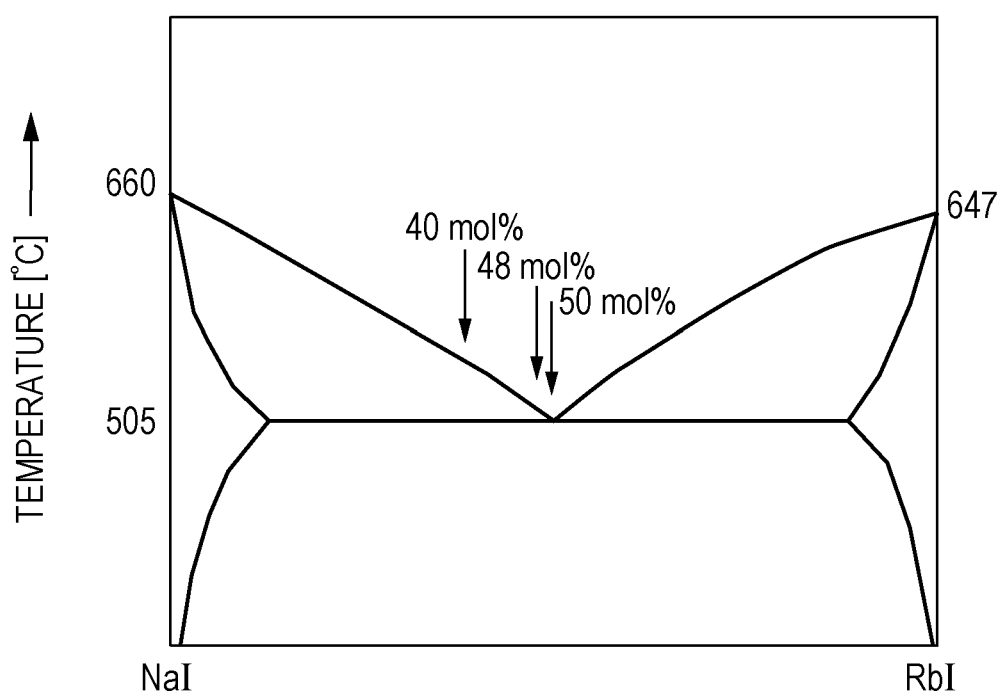
FIG. 14 is a schematic equilibrium diagram of a NaI—RbI system.

From three types of samples of NaI—RbI (40, 48, and 50 percent by mole) indicated by arrows in an equilibrium diagram of a NaI—RbI system shown in FIG. 14, three types of phase separation scintillators were formed using an apparatus similar to that of Example 9 shown in FIG. 2A. In addition, from these three types of samples, three types of phase separation scintillators were formed using the apparatus shown in FIG. 2B in which the heater portion was narrow and the sample was locally heated. As described above, totally six types of phase separation scintillators were prepared. The NaI—RbI (40 percent by mole) indicated that the molar ratio of NaI to RbI was 40:60. As in the case described above, in NaI—RbI (48 percent by mole), the molar ratio of NaI to RbI was 48:52, and in NaI—RbI (50 percent by mole), the molar ratio of NaI to RbI was 50:50. In the case in which solidification was started after the entire sample was melted at an early stage as in the case of Example 9, from all the samples, scintillators each having an excellent structure as shown in FIG. 12B or 12C were obtained. However, in the case of NaI—RbI (40 percent by mole), a crystal was formed together with precipitation of NaI dendrites in a solidification initial area of the sample, and thereafter, a region of an excellent unidirectional phase separation structure was formed. As for NaI—RbI (48 percent by mole) and NaI—RbI (50 percent by mole), a dendrite region as that of NaI—RbI (40 percent by mole) was not clearly formed at a solidification initial stage, and a significant difference was not seen between these two samples. However, since the difference caused by the difference in concentration of 2 percent by mole may also be partially influenced by impurities of raw materials, it did not indicate that no difference was present. As described above, when the entire sample was melted, since a material deviated from a eutectic composition was precipitated in the solidification initial area of the sample at a higher temperature than the eutectic point. Hence, it is believed that a remaining melt portion was converged to the eutectic composition, and subsequently, preferable structure formation was performed.

In addition, when solidification was performed while a local area of the sample was being melted as shown in FIG. 2B, NaI dendrites were present at any place of the sample of the NaI—RbI (40 percent by mole) system, and a targeted structure was not obtained. However, in the case of NaI—RbI (48 percent by mole) and NaI—RbI (50 percent by mole), the columnar crystals of NaI were formed over the entire area and an excellent sample could be obtained. However, it was observed that although being influenced by impurities and the like, the structure of the sample of NaI—RbI (48 percent by mole) was more distorted than that of the sample of NaI—RbI (50 percent by mole). Hence, when the solidification was performed by local melting, it was found that since this solidification was not subjected to a process in which the composition was optimized in the sample when the entire was melted, the composition and the structure sensitively influenced each other.

Hence, in the phase separation scintillator crystal body of the present invention, although a slight fluctuation of the composition of approximately 2 percent by mole had not considerable adverse influence on the structure formation, a considerable fluctuation of 10 percent by mole had adverse influences; hence, it was clear that the optimal composition was in the vicinity of the eutectic composition. In addition, it was found that when solidification was controlled after the entire sample was melted in the manufacturing, even if the composition was deviated from the eutectic composition, a deviated material was preferentially precipitated in the solidification initial area of the sample, and an excellent region could be obtained from the remaining melt of the eutectic composition, and this finding is important.

Example 12

Examples 12 to 15 are examples corresponding to the above third embodiment and will be sequentially described.

In Example 12, powders each having a eutectic composition of the same material system as that shown in Table 9 were prepared and were vacuum-sealed in respective quartz tubes to form samples. Next, after the sample was placed in a Bridgman furnace as shown by the perspective view of FIG. 2A and was increased in temperature to 800° C. so as to be entirely melted, the temperature was held for 30 minutes, and the melt temperature was then decreased to a temperature 20° C. higher than the eutectic point shown in Table 9. Subsequently, the sample was pulled down at a rate of approximately 10 mm/hour so as to be sequentially solidified from a lower portion thereof. In addition, when the sample entered a region in which cooling water of the furnace was circulated, the difference in temperature at a solid-liquid interface which was the boundary between a portion at which the sample was melted and a portion at which the sample was solidified was set to 30° C./mm or more. The samples thus formed were each processed by cutting along a plane (the first principal surface or the second principal surface) perpendicular to the pull-down direction of the sample, and the transmission image was obtained by an optical microscope. The results are shown in FIGS. 15A to 15F.

Figure 15A:
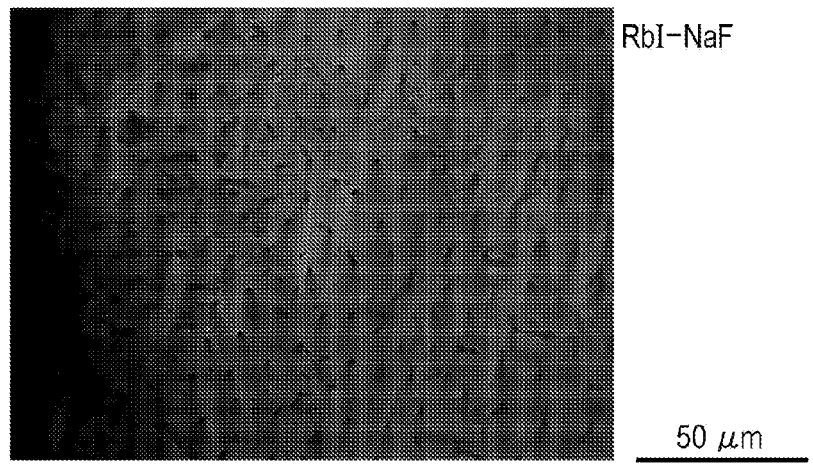
FIGS. 15A to 15F are each a transmission optical microscope image of a phase separation scintillator crystal body.

FIG. 15A shows an image of the RbI—NaF system. From FIG. 15A, it was found that the structure was formed such that columnar crystals of NaF were surrounded by RbI. This structure corresponded to the first configuration, the first crystal phase was NaF, and the second crystal phase was RbI.

Figure 15B:
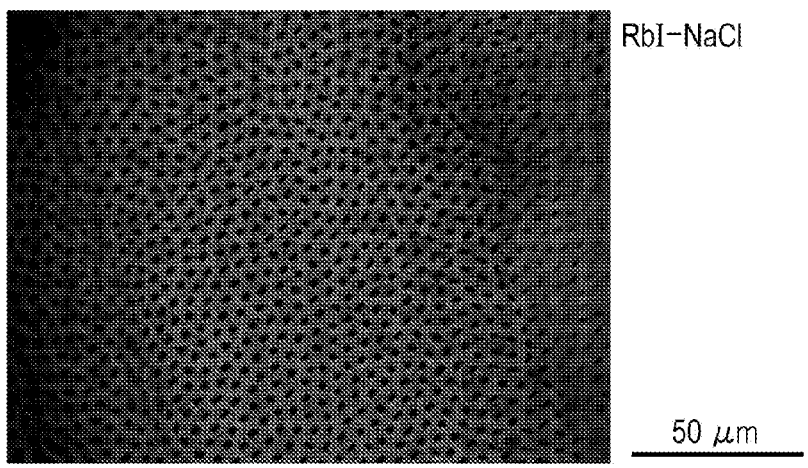

FIG. 15B shows an image of the RbI—NaCl system. From FIG. 15B, it was found that the structure was formed such that columnar crystals of NaCl were surrounded by RbI. This structure corresponded to the first configuration, the first crystal phase was NaCl, and the second crystal phase was RbI.

Figure 15C:
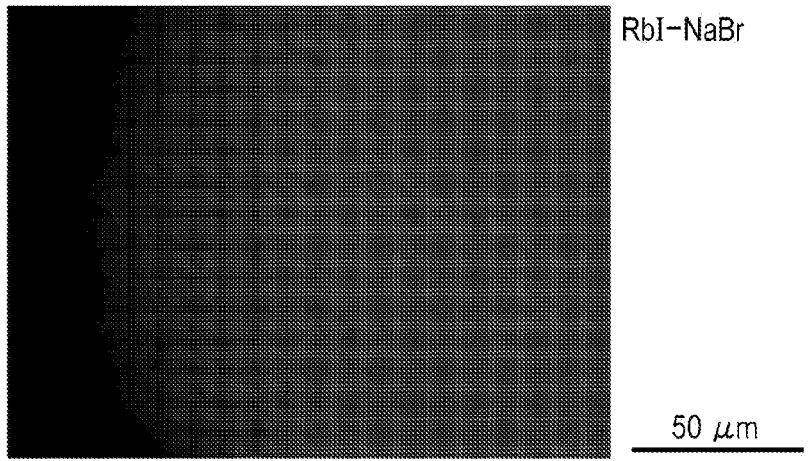

FIG. 15C shows an image of the RbI—NaBr system. From FIG. 15C, it was found that the structure was formed such that plate crystals of NaBr and plate crystals of RbI were alternately disposed in close contact with each other. This structure corresponded to the second configuration, the first crystal phase was RbI and the second crystal phase was NaBr.

Figure 15D:
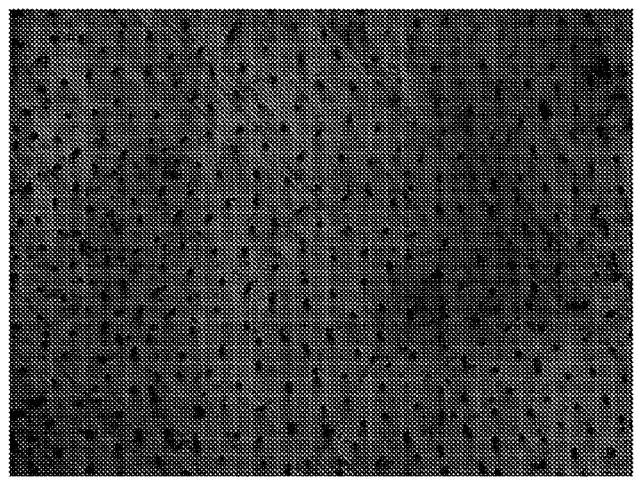

FIG. 15D shows an image of the CsBr—NaF system. From FIG. 15D, it was found that the structure was formed such that columnar crystals of NaF were surrounded by CsBr. This structure corresponded to the first configuration, the first crystal phase was NaF, and the second crystal phase was CsBr.

Figure 15E:
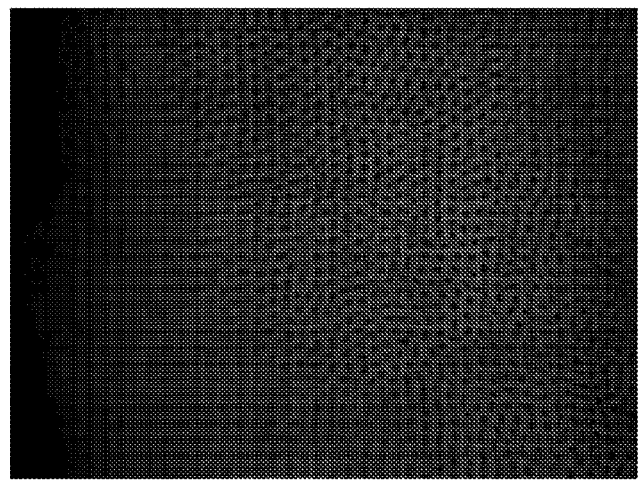

FIG. 15E shows an image of the CsBr—NaCl system. From FIG. 15 (E), it was found that the structure was formed such that columnar crystals of NaCl were surrounded by CsBr. This structure corresponded to the first configuration, the first crystal phase was NaCl, and the second crystal phase was CsBr.

Figure 15F:
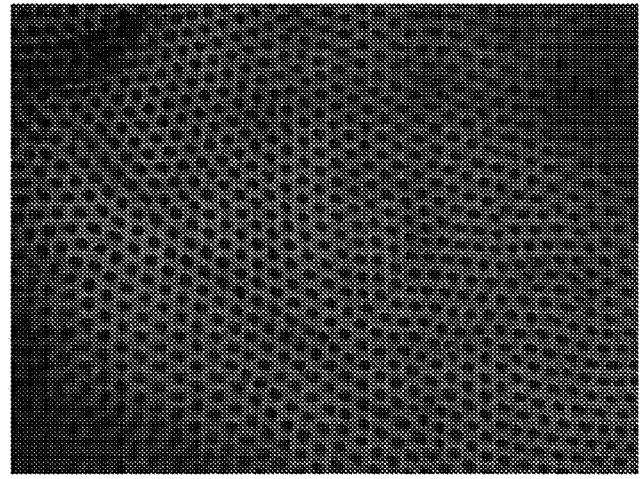

FIG. 15F shows an image of the CsBr—NaBr system. From FIG. 15F, it was found that the structure was formed such that columnar crystals of NaBr were surrounded by CsBr. This structure corresponded to the first configuration, the first crystal phase was NaBr, and the second crystal phase was CsBr.

Figure 16G:
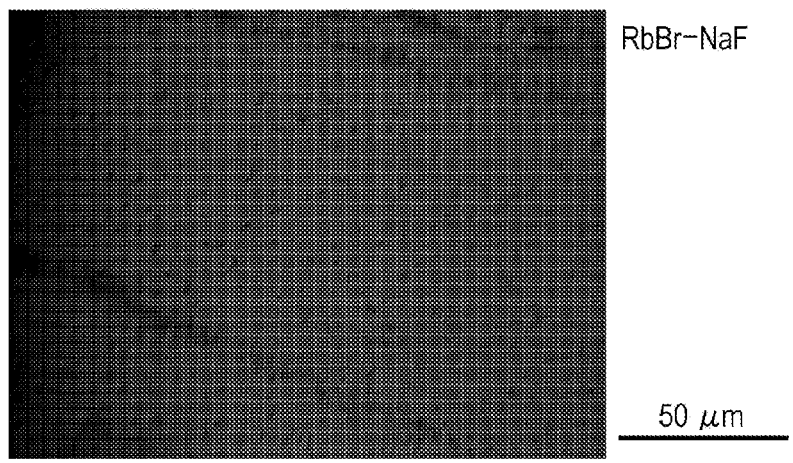
FIGS. 16G to 16L are each a transmission optical microscope image of a phase separation scintillator crystal body.

FIG. 16G shows an image of the RbBr—NaF system. From FIG. 16G, it was found that the structure was formed such that columnar crystals of NaF were surrounded by RbBr. This structure corresponded to the first configuration, the first crystal phase was NaF, and the second crystal phase was RbBr.

Figure 16H:
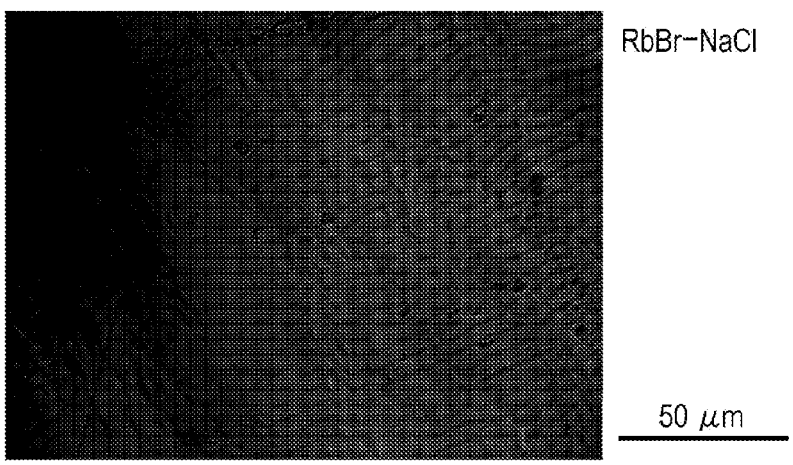

FIG. 16H shows an image of the RbBr—NaCl system. From FIG. 16H, it was found that the structure was formed such that plate crystals of NaCl and plate crystals of RbBr were alternately disposed in close contact with each other. This structure corresponded to the second configuration, the first crystal phase was RbBr, and the second crystal phase was NaCl.

Figure 16I:
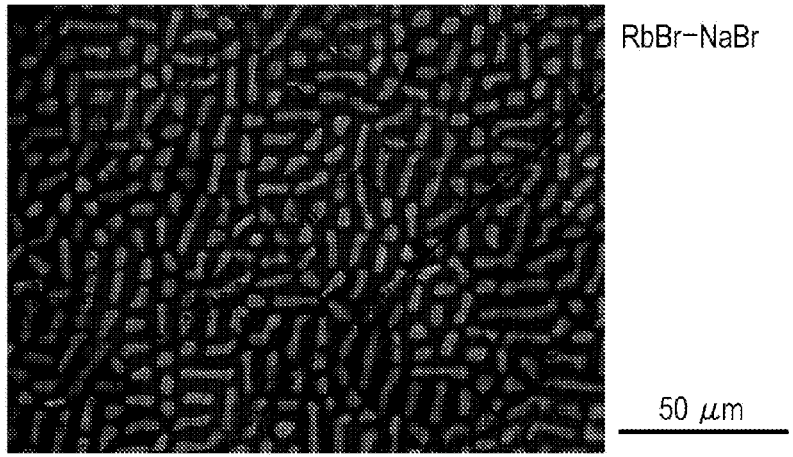

FIG. 16I shows an image of the RbBr—NaBr system. From FIG. 16I, it was found that the structure was formed such that columnar crystals of NaBr were surrounded by RbBr. This structure corresponded to the third configuration, the first crystal phase was RbBr, and the second crystal phase was NaBr.

Figure 16J:
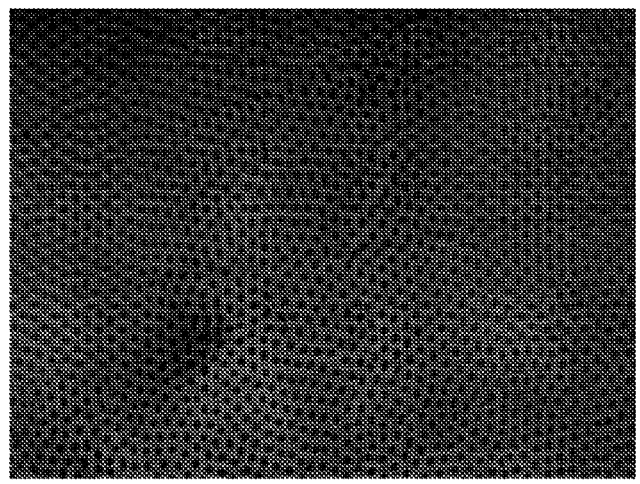

FIG. 16J shows an image of the CsCl—NaCl system. From FIG. 16J, it was found that the structure was formed such that columnar crystals of NaCl were surrounded by CsCl. This structure corresponded to the first configuration, the first crystal phase was NaCl, and the second crystal phase was CsCl.

Figure 16K:
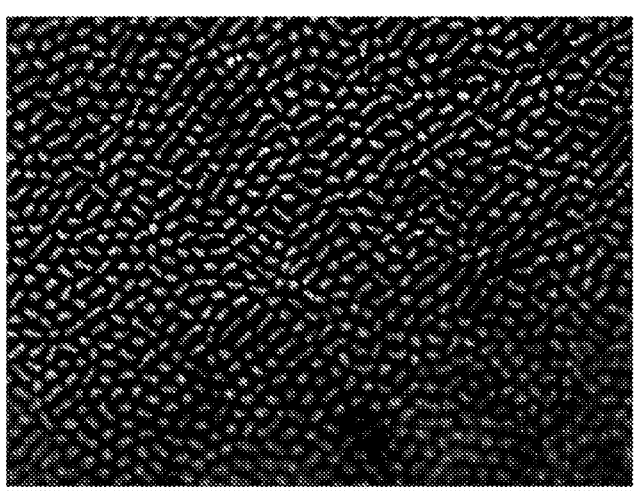

FIG. 16K shows an image of the RbCl—NaCl system. From FIG. 16K, it was found that the structure was formed such that columnar crystals of NaCl were surrounded by RbCl. This structure corresponded to the third configuration, the first crystal phase was RbCl, and the second crystal phase was NaCl.

Figure 16L:
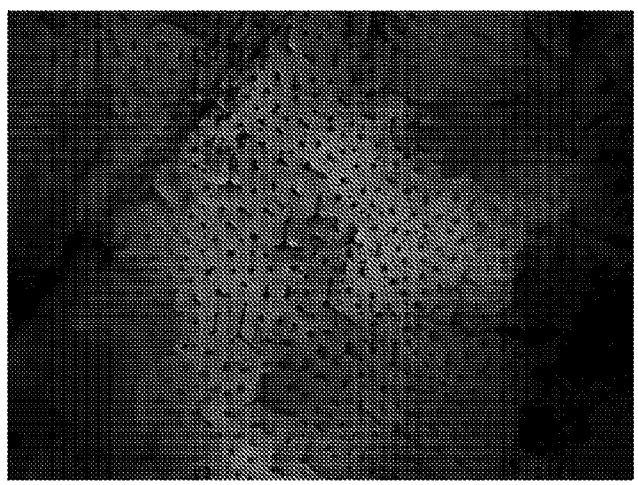

FIG. 16L shows an image of the RbCl—NaF system. From FIG. 16L, it was found that the structure was formed such that columnar crystals of NaF were surrounded by RbCl. This structure corresponded to the first configuration, the first crystal phase was NaF, and the second crystal phase was RbCl.

Since these images were obtained by cutting the sample along the plane (the first principal surface, the second principal surface) perpendicular to the pull-down direction, the columnar crystal was observed as a point or a plate. However, it was confirmed that the columnar crystal was continuously formed in one direction in a plane parallel to the pull-down direction, and it could be confirmed that the phase separation structure of the present invention was formed by the unidirectional solidification. In this example, since scratches and/or distortions of the image in some regions were caused, for example, by marks formed by polishing in the sample formation, and blurs were caused by deliquescence of materials and deviation of focus due to an inclined sample, the essence of the present invention was not influenced thereby.

In addition, the optical microscope images shown in FIGS. 15A to 16L were each obtained by a transmission arrangement, and it was confirmed that the crystal phase which looked bright in each image was formed of the material at a higher refractive index side (second crystal phase) shown in Table 10; hence, it was shown that the scintillator crystal body of the present invention had a light guide function by the difference in refractive index.

According to those described above, it was confirmed that even if the primary component of the second crystal phase which was a high refractive-index crystal phase was formed of a material other than a scintillator material, a phase separation scintillator structure in which one of the two phases contained RbI, CsBr, RbBr, CsCl, or RbCl as a primary component also had a light guide property.

Example 13

This example relates to a concrete example in which another material was added to RbI, CsBr, or RbBr which formed one of the crystal phases.

As in the case of Example 12, the following material systems were vacuum-sealed in respective quartz tubes, and samples were formed.

As a concrete example in which CsI or RbBr was added to RbI which was a primary component, (RbI85-CsI15)—NaCl and (RbI80-RbBr20)-NaCl were formed. In addition, as a concrete example in which CsI, RbBr or CsCl was added to CsBr which was a primary component, (CsBr80-CsI20)-NaCl, (CsBr50-CsI50)-NaCl, (CsBr80-RbBr20)-NaCl, (CsBr80-CsCl20)-NaCl, and (CsBr60-CsCl40)-NaCl were formed. Furthermore, as a concrete example in which RbI or CsBr was added to RbBr which was a primary component, (RbBr95-RbI5)-NaCl, (RbBr50-RbI50)-NaCl, and (RbBr90-CsBr10)-NaCl were formed. In the case of (RbI85-CsI15)-NaCl, the above composition notation indicates that the composition ratio of RbI to CsI is 85:15 percent by mole. In addition, when materials forming one crystal phase were mix-crystallized, it was very complicated to calculate a eutectic composition with a material forming the other crystal phase for each composition; hence, NaCl was selected as a representative example of the primary component of the other crystal phase, and a starting composition was formed in which 35 percent by mole of NaCl was contained with respect to the one crystal phase. However, the formation was performed using the formation apparatus shown in FIG. 2A so that a targeted structure was not adversely influenced by a component deviated from the composition.

The sample thus formed was processed by cutting along a plane (the first principal surface, the second principal surface) perpendicular to the pull-down direction as in the case of Example 12, and the transmission image was obtained by an optical microscope. The results are shown in FIGS. 17A to 17F.

Figure 17A:
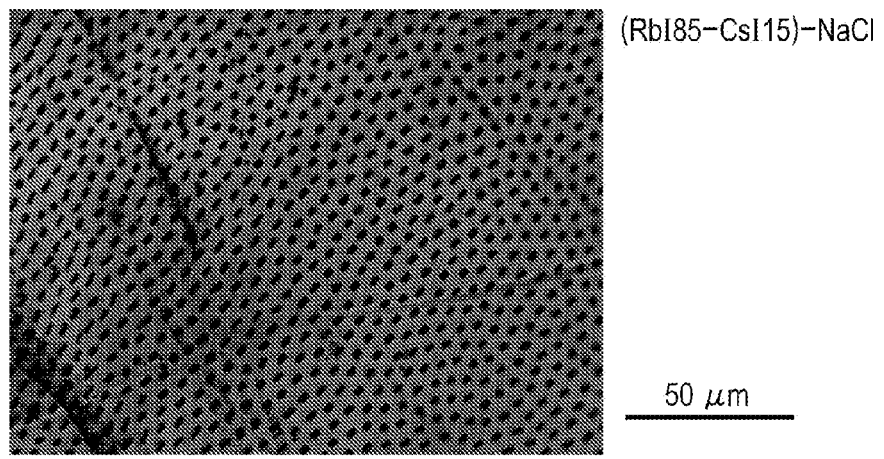
FIGS. 17A to 17F are each a transmission optical microscope image of a phase separation scintillator crystal body.

FIG. 17A shows an image of the (RbI85-CsI15)-NaCl system. From FIG. 17A, it was found that the structure was formed such that NaCl columnar crystals were surrounded by a (RbI85-CsI15) mixed crystal. This structure corresponded to the first configuration, the first crystal phase was NaCl, and the second crystal phase was (RbI85-CsI15).

Figure 17B:
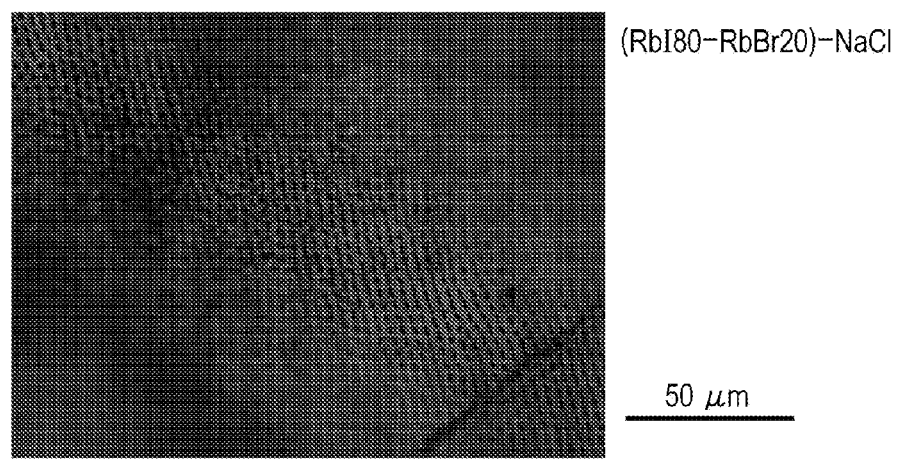

FIG. 17B shows an image of the (RbI80-RbBr20)-NaCl system. From FIG. 17B, it was found that the structure was formed such that NaCl columnar crystals were surrounded by a (RbI80-RbBr20) mixed crystal. This structure corresponded to the first configuration, the first crystal phase was NaCl, and the second crystal phase was (RbI80-RbBr20).

Figure 17C:
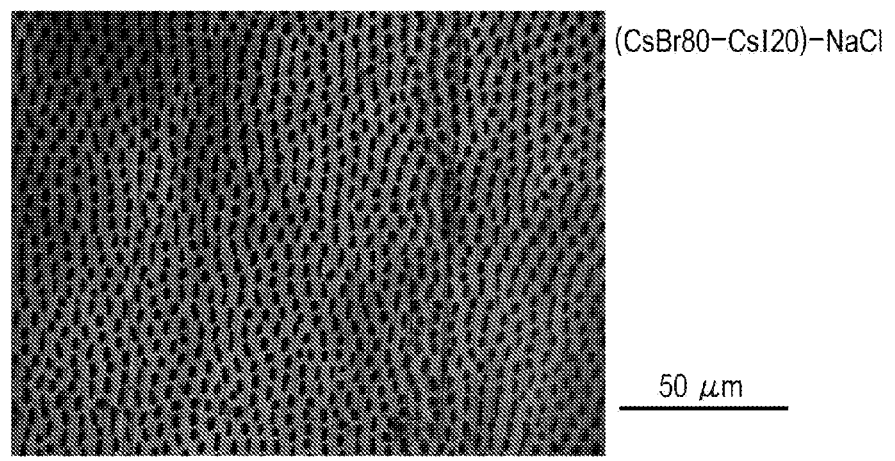

FIG. 17C shows an image of the (CsBr80-CsI20)-NaCl system. From FIG. 17C, it was found that the structure was formed such that NaCl columnar crystals were surrounded by a (CsBr80-CsI20) mixed crystal. This structure corresponded to the first configuration, the first crystal phase was NaCl, and the second crystal phase was (CsBr80-CsI20).

Figure 17D:
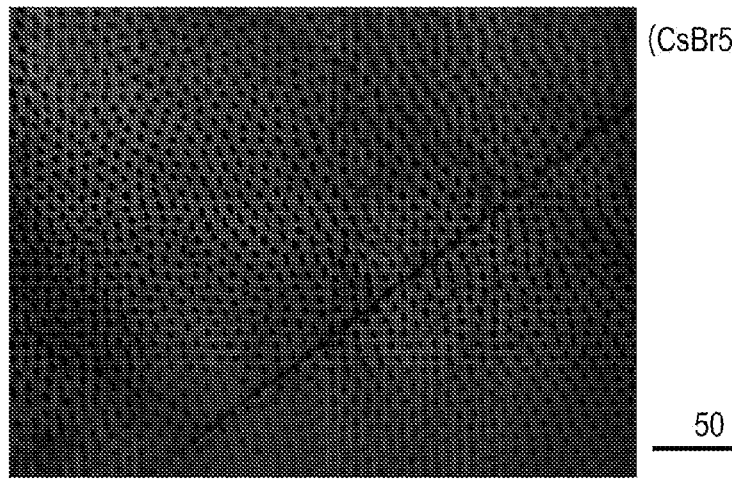

FIG. 17D shows an image of the (CsBr50-CsI50)-NaCl system. From FIG. 17D, it was found that the structure was formed such that NaCl columnar crystals were surrounded by a (CsBr50-CsI50) mixed crystal. This structure corresponded to the first configuration, the first crystal phase was NaCl, and the second crystal phase was (CsBr50-CsI50).

Figure 17E:
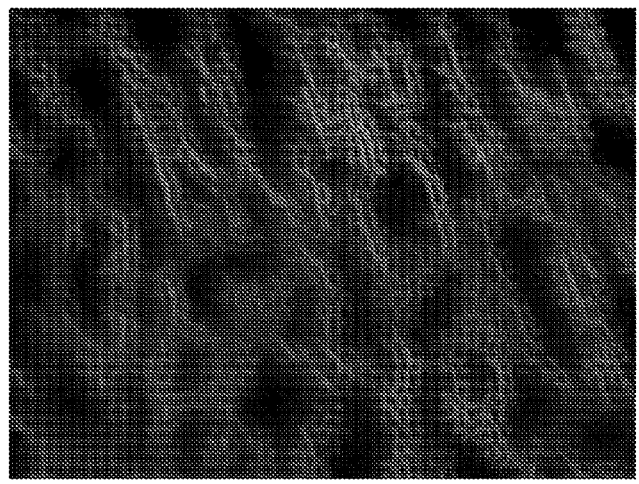

FIG. 17E shows an image of the (CsBr80-RbBr20)-NaCl system. From FIG. 17E, it was found that the structure was formed such that NaCl columnar crystals were surrounded by a (CsBr80-RbBr20) mixed crystal. This structure corresponded to the first configuration, the first crystal phase was NaCl, and the second crystal phase was (CsBr80-RbBr20). In this sample, a region in which NaCl columnar crystals were not straight was generated by the influence in the sample formation, and dark regions larger than intrinsic dark points to be observed were scattered in a transmission image; however, the essence of the present invention was not influenced thereby.

Figure 17F:
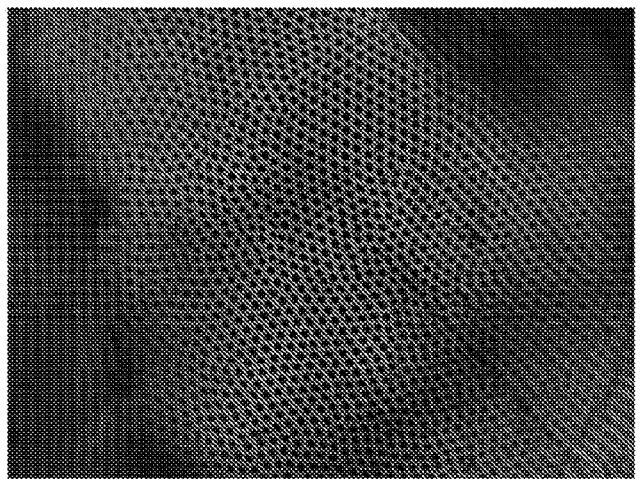

FIG. 17F shows an image of the (CsBr80-CsCl20)-NaCl system. From FIG. 17F, it was found that the structure was formed such that NaCl columnar crystals were surrounded by a (CsBr80-CsCl20) mixed crystal. This structure corresponded to the first configuration, the first crystal phase was NaCl, and the second crystal phase was (CsBr80-CsCl20).

Figure 18G:
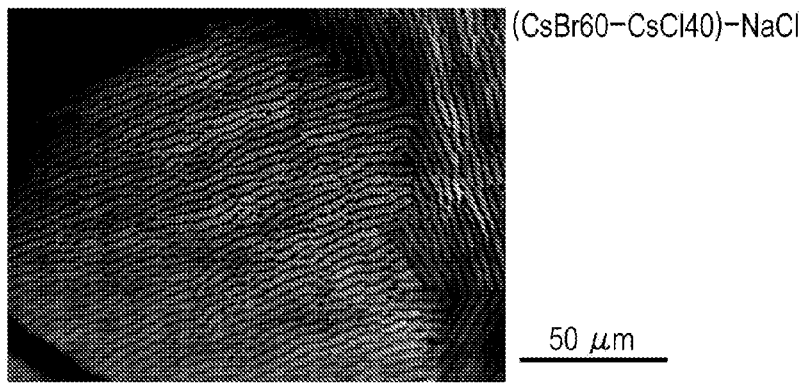
FIGS. 18G to 18J are each a transmission optical microscope image of a phase separation scintillator crystal body.

FIG. 18G shows an image of the (CsBr60-CsCl40)-NaCl system. From FIG. 18G, it was found that the structure was formed such that NaCl columnar crystals were surrounded by a (CsBr60-CsCl40) mixed crystal. This structure corresponded to the first configuration, the first crystal phase was NaCl, and the second crystal phase was (CsBr60-CsCl40).

Figure 18H:
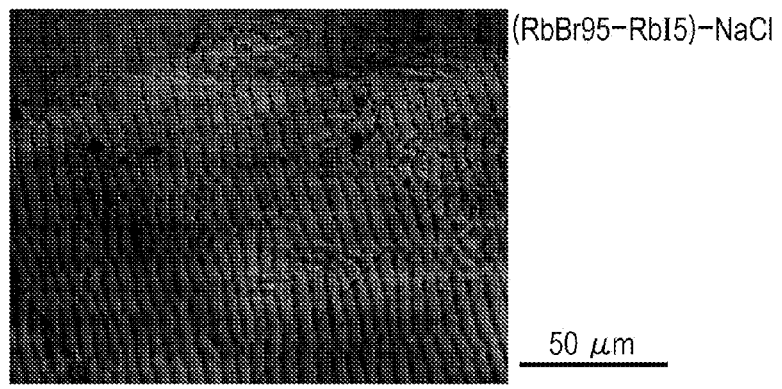

FIG. 18H shows an image of the (RbBr95-RbI5)-NaCl system. From FIG. 18H, it was found that the structure was formed such that NaCl plate crystals and plate crystals of a (RbBr95-RbI5) mixed crystal were alternately disposed in close contact with each other. This structure corresponded to the second configuration, the first crystal phase was (RbBr95-RbI5), and the second crystal phase was NaCl.

Figure 18I:
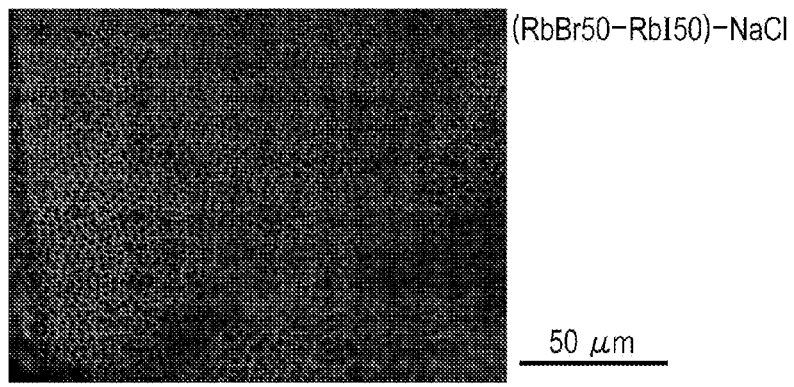

FIG. 18I shows an image of the (RbBr50-RbI50)-NaCl system. From FIG. 18I, it was found that the structure was formed such that NaCl columnar crystals were surrounded by a (RbBr50-RbI50) mixed crystal. This structure corresponded to the first configuration, the first crystal phase was NaCl, and the second crystal phase was (RbBr50-RbI50).

Figure 18J:
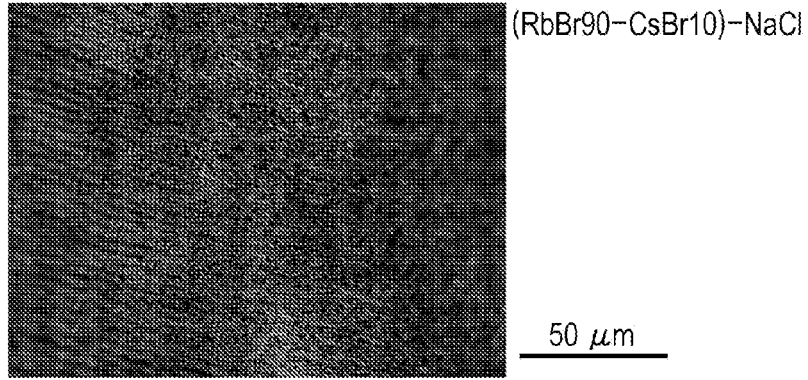

FIG. 18J shows an image of the (RbBr90-CsBr10)-NaCl system. From FIG. 18J, it was found that the structure was formed such that NaCl plate crystals and plate crystals of a (RbBr90-CsBr10) mixed crystal were alternately disposed in close contact with each other. This structure corresponded to the second configuration, the first crystal phase was (RbBr90-CsBr10), and the second crystal phase was NaCl. In addition, the optical microscope images shown in FIGS. 17A to 18J were each obtained by a transmission arrangement, and it was confirmed that the crystal phase which looked bright in each image was formed of the material at a higher refractive index side (second crystal phase); hence, it was shown that the scintillator crystal body of the present invention had a light guide function by the difference in refractive index.

As described above, it was confirmed that even if the mixed crystal was used for one crystal phase of the present invention instead of using a single material, this structure functioned as a phase separation scintillator and also had a light guide property.

Example 14

This example relates to the addition of a luminescence center.

By using a formation method similar to that of Example 12, samples were formed by combinations in which 0.01 percent by mole of TlI (thallium iodide), InI (indium iodide), and Ga (gallium) were separately added to all material systems. When these samples were excited by x rays obtained at 60 kV and 1 mA using a tungsten bulb, in all the combinations, the luminescence of the crystal body could be confirmed by visual inspection.

Hence, it was confirmed that the phase separation structure of the present invention functioned as a scintillator crystal body which could emit light by radiation excitation.

Example 15

This example relates to the composition of a phase separation scintillator.

Figure 19:
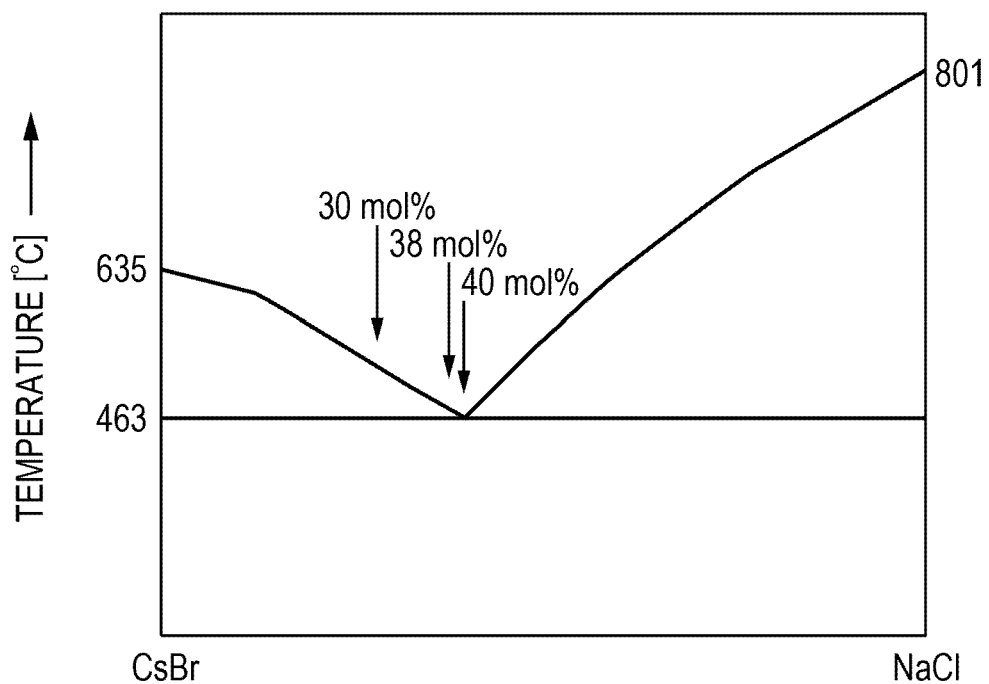
FIG. 19 is a schematic equilibrium diagram of a CsBr—NaCl system.
Figure 20A:
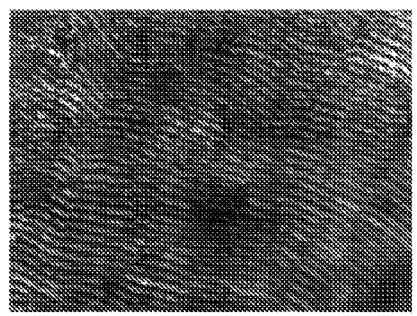
FIGS. 20A to 20E are each a transmission optical microscope image of a phase separation scintillator crystal body.
Figure 20B:
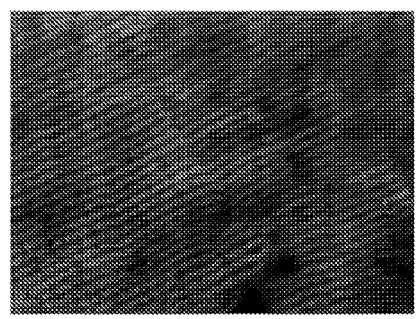
Figure 20C:
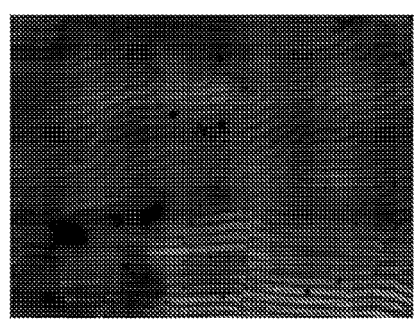
Figure 20D:
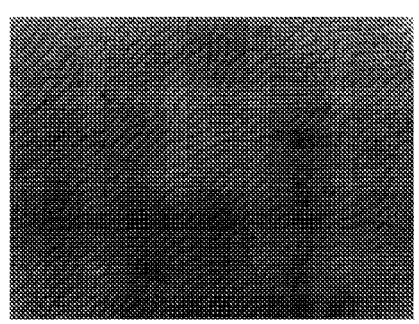
Figure 20E:
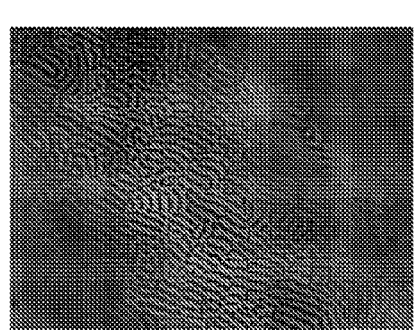

From three types of samples of CsBr—NaCl (30, 38, and 40 percent by mole) shown by arrows in an equilibrium diagram of a CsBr—NaCl system of FIG. 19, three types of phase separation scintillators were formed using an apparatus similar to that of Example 1 shown in FIG. 2A. In addition, from these three types of samples, three types of phase separation scintillators were formed using the apparatus shown in FIG. 2B in which the heater portion was narrow and the sample was locally heated. As described above, totally six types of phase separation scintillators were prepared. In this example, CsBr—NaCl (30 percent by mole) indicates that the molar ratio of CsBr to NaCl is 70:30. In the same manner as described above, CsBr—NaCl (38 percent by mole) and CsBr—NaCl (40 percent by mole) also indicate that the molar ratios of CsBr to NaCl are 62:38 and 60:40, respectively.

In the case in which solidification was started after the entire sample was melted at an early stage as in the case of Example 12, from all the samples, scintillators each having an excellent structure as shown in FIG. 15E were obtained. However, in the case of CsBr—NaCl (30 percent by mole), a crystal was formed together with precipitation of CsBr dendrites in a solidification initial area of the sample, and thereafter, a region of an excellent unidirectional phase separation structure was formed. As for CsBr—NaCl (38 percent by mole) and CsBr—NaCl (40 percent by mole), a dendrite region as that of CsBr—NaCl (30 percent by mole) was not clearly formed at an early stage of the solidification, and a significant difference was not seen between the above two samples. However, since the difference caused by the difference in concentration of 2 percent by mole may also be partially influenced by impurities of raw materials, it did not indicate that no difference was present. As described above, when the entire sample was melted, since a material deviated from a eutectic composition was precipitated in the solidification initial area of the sample at a higher temperature than the eutectic point. Hence, it is believed that a remaining melt portion was converged to the eutectic composition, and subsequently, preferable structure formation was performed.

In addition, when solidification was performed while a local area of the sample was being melted as shown in FIG. 2B, CsBr dendrites were present at any place of the sample of the CsBr—NaCl (30 percent by mole) system, and a targeted structure was not obtained. However, in the case of CsBr—NaCl (38 percent by mole) and CsBr—NaCl (40 percent by mole), the columnar crystals of CsBr were formed over the entire area and an excellent sample could be obtained. However, it was observed that although being influenced by impurities and the like, the structure of the sample of CsBr—NaCl (38 percent by mole) was more distorted than that of the sample of CsBr—NaCl (40 percent by mole). Hence, when the solidification was performed by local melting, it was found that since this solidification was not subjected to a process in which the composition was optimized in the sample when the entire was melted, the composition and the structure sensitively influenced each other.

Hence, in the phase separation scintillator crystal of the present invention, although a slight fluctuation of the composition, such as approximately 2 percent by mole, had not considerable adverse influence on the structure formation, since a considerable fluctuation of 10 percent by mole had influences, it was clear that the optimal composition was in the vicinity of the eutectic composition. In addition, it was found that when solidification was controlled after the entire sample was melted in the manufacturing, even if the composition was deviated from the eutectic composition, a deviated material was preferentially precipitated in the solidification initial area of the sample, and an excellent region could be obtained from the remaining melt of the eutectic composition, and this finding is important.

Example 16

Examples 16 and 17 are examples corresponding to the above fourth embodiment and will be described in this order.

In this example, first, powders of five material systems were prepared in which BaI$_2$—NaI, BaBr$_2$—NaBr, BaCl$_2$—NaCl, SrBr$_2$—NaBr, and SrCl$_2$—NaCl each had mixing ratios of 50:50, 40:60, 40:60, 60:40, and 52:48, and were separately vacuum-sealed in respective quartz tubes, so that samples were formed. Next, after the sample was placed in a Bridgman furnace as shown by the perspective view of FIG. 2A and was increased in temperature to 800° C. so that the entire sample was sufficiently melted, the temperature was held for 30 minutes, and the melt temperature was then decreased to a temperature 20° C. higher than the eutectic point shown in Table 12. Subsequently, the sample was pulled down at a rate of approximately 10 mm/hour so that the sample was sequentially solidified from a lower portion thereof.

In addition, when the sample entered a region in which cooling water of the furnace was circulated by the pull-down of the sample, the difference in temperature at a solid-liquid interface which was the boundary between a portion at which the sample was melted and a portion at which the sample was solidified was set to 30° C./mm or more. Five types of samples thus formed were each processed by cutting, and the transmission image (image of the first principal surface, the second principal surface) was obtained by an optical microscope. As a result, images of FIGS. 20A to 20E of the five material systems were obtained. Since the phases of BaI$_2$, BaBr$_2$, BaCl$_2$, SrBr$_2$, and SrCl$_2$, each having a high refractive index, looked bright, and the low refractive-index phase looked dark, it was confirmed that a desired structure of the present invention could be formed, and at the same time, a light guide function was obtained.

In this example, since scratches and/or distortions of the image in some regions were caused by marks formed by polishing in the sample formation, and blurs were caused by deliquescence of materials and deviation of focus due to an inclined sample, the essence of the present invention was not influenced thereby.

Example 17

This example relates to the addition of a luminescence center.

By a formation method similar to that of Example 16, samples were formed in which five material systems, that is, $BaI_2$—NaI, $BaBr_2$—NaBr, $BaCl_2$—NaCl, $SrBr_2$—NaBr, and $SrCl_2$—NaCl, were each added with 0.5 percent by mole of one selected from $EuI_2$, $EuBr_2$, and $EuCl_2$ so that the halogens coincided therebetween. When the luminescence was confirmed by x-ray excitation, spectra having peaks at approximately 420 nm, 400 nm, 400 nm, 400 nm, and 410 nm were obtained, and it was found that the response to radiation could be obtained by addition of the luminescence center.

In addition, as in the case of Example 8 described above, when the radiation detector shown in FIG. 21 was formed such that the phase separation scintillator crystal body described in one of Examples 9 to 17 described above was disposed on a photodetector array so that the first principal surface or the second principal surface faces photodetectors, it was also confirmed from an output of the photodetector array that compared to a radiation detector using a single crystal scintillator without using partitions, the spread of light was suppressed.

Since emitting light by radiation and having properties of guiding emitted light, when the phase separation scintillator crystal body of the present invention is used in combination with a photodetector without forming related partitions, this combination is quite useful as a radiation detector. In particular, the phase separation scintillator crystal body of this embodiment can be used, for example, as a measurement apparatus for medical use, industrial use, high-energy physical use, and space use, in each of which radiation, such as x rays, is used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-017378, filed Jan. 28, 2010, No. 2010-088982, filed Apr. 7, 2010, No. 2010-162017, filed Jul. 16, 2010, and No. 2010-269728, filed Dec. 2, 2010, which are hereby incorporated by reference herein in their entirety.

The invention claimed is:

1. A scintillator having a first surface and a second surface that are not located on the same plane, the scintillator comprising:
   a first crystal phase and a second crystal phase,
   wherein the first crystal phase forms, together with the second crystal phase, a eutectic structure, and has a refractive index that allows total reflection of light from the second crystal phase,
   each of the first crystal phase and the second crystal phase continuously extends from a surface portion of the first surface to a surface portion of the second surface, and
   the first crystal phase is located around the second crystal phase, or the second crystal phase is located around the first crystal phase.

2. The scintillator crystal body according to claim 1, wherein the first crystal phase or the second crystal phase has a shape of a column or a plate.

3. The scintillator according to claim 2, comprising a plurality of the first crystal phases having a shape of a column or a plate or a plurality of the second crystal phases having a shape of a column or a plate, and
   the plurality of crystal phases are periodically arranged along the first surface or the second surface at a period of 500 nm or more and 50 μm or less.

4. The scintillator according to claim 1,
   wherein the second crystal phase emits light by radiation excitation.

5. The scintillator according to claim 1,
   wherein a composition ratio of the first crystal phase and the second crystal phase is within ±4 percent by mole with respect to a eutectic composition ration of the first crystal phase and the second crystal phase.

6. The scintillator according to claim 1,
   wherein the first crystal phase or the second crystal phase includes at least one of Tl, In, and Ga as a luminescence center.

7. The scintillator crystal body according to claim 1,
   wherein the first crystal phase or the second crystal phase contains CsI.

8. The scintillator according to claim 7,
   wherein the first crystal phase or the second crystal phase that contains CSI contains one of RbI, CsBr, and RbBr, and
   the content of RbI is in a range of more than 0 to 20 percent by mole,
   the content of CsBr is in a range of more than 0 to less than 50 percent by mole, and
   the content of RbBr is in a range of more than 0 to 10 percent by mole.

9. The scintillator according to claim 1,
   wherein the second crystal phase contains CsI, and
   the first crystal phase contains one of NaBr, NaCl, NaF, and KCl.

10. The scintillator crystal body according to claim 1,
    wherein the first crystal phase or the second crystal phase contains NaI.

11. The scintillator according to claim 1,
    wherein the second crystal phase contains NaI, and
    a phase of the first crystal phase contains one of NaF, NaCl, RbI and CsI.

12. The scintillator according to claim 1,
    wherein the first crystal phase or the second crystal phase contains RbI.

13. The scintillator according to claim 1,
    wherein the first crystal phase or the second crystal phase contains CsBr.

14. The scintillator according to claim 1,
    wherein the first crystal phase or the second crystal phase contains RbBr.

15. The scintillator according to claim 1,
    wherein one phase of the first crystal phase and the second crystal phase contains one of RbI, CsBr, and RbBr, and
    the other phase of the crystal phases contains one of NaF, NaCl, and NaBr.

16. The scintillator according to claim 15,
    wherein one crystal phase of the first crystal phase and the second crystal phase contains RbI,
    the one crystal phase contains CsI or RbBr,
    the content of CsI is in a range of more than 0 to 20 percent by mole, and the content of RbBr is in a range of more than 0 to less than 50 percent by mole.

17. The scintillator according to claim 15,
wherein one crystal phase of the first crystal phase and the second crystal phase contains CsBr,
the one crystal phase contains one of CsI, RbBr, and CsCl,
the content of CsI is in a range of more than 0 to 50 percent by mole,
the content of RbBr is in a range of more than 0 to less than 25 percent by mole, and
the content of CsCl is in a range of more than 0 to less than 50 percent by mole.

18. The scintillator according to claim 15,
wherein one crystal phase of the first crystal phase and the second crystal phase contains RbBr,
the one crystal phase contains RbI or CsBr,
the content of RbI is in a range of more than 0 to 50 percent by mole, and
the content of CsBr is in range of more than 0 to 15 percent by mole.

19. The scintillator according to claim 1,
wherein the second crystal phase contains one of $BaI_2$, $BaBr_2$, $BaCl_2$, $SrBr_2$, and $SrCl_2$.

20. The scintillator according to claim 19,
wherein one of the first crystal phase and the second crystal phase includes at least one of europium (Eu), cerium (Ce), thallium (Tl), indium (In), and gallium (Ga) as a luminescence center.

21. A radiation detector comprising a photodetector and a scintillator disposed to face the photodetector,
wherein the scintillator is the scintillator according to claim 1.

22. The radiation detector according to claim 21, wherein the photodetector and the scintillator are disposed to face each other with or without at least one protective layer interposed therebetween.

23. A scintillator having a first surface and a second surface that are not located on the same plane, the scintillator comprising a first crystal phase and a second crystal phase,
wherein the first crystal phase forms, together with the second crystal phase, a eutectic structure, and has a refractive index that is 0.973 or less times a refractive index of the second crystal phase,
the second crystal phase emits light by radiation excitation,
each of the first crystal phase and the second crystal phase continuously extends from a surface portion of the first surface to a surface portion of the second surface, and
the first crystal phase is located around the second crystal phase, or the second crystal phase is located around the first crystal phase.

24. A radiation detector comprising a photodetector and a scintillator disposed to face the photodetector,
wherein the scintillator is the scintillator according to claim 23.

25. A scintillator having a first surface and a second surface that are not located on the same plane, the scintillator comprising a first crystal phase and a second crystal phase,
wherein the first crystal phase forms, together with the second crystal phase, a eutectic structure, emits light by radiation excitation, and has a refractive index that is 0.987 or less times a refractive index of the second crystal phase,
each of the first crystal phase and the second crystal phase continuously extends from a surface portion of the first surface to a surface portion of the second surface, and
the first crystal phase is located around the second crystal phase, or the second crystal phase is located around the first crystal phase.

26. A radiation detector comprising a photodetector and a scintillator disposed to face the photodetector,
wherein the scintillator is the scintillator according to claim 25.

\* \* \* \* \*